United States Patent
Edamura et al.

(10) Patent No.: US 7,359,418 B2
(45) Date of Patent: Apr. 15, 2008

(54) QUANTUM CASCADE LASER

(75) Inventors: Tadataka Edamura, Hamamatsu (JP); Naota Akikusa, Hamamatsu (JP)

(73) Assignee: Hamamatsu Photonics K.K., Shizuoka (JP)

( * ) Notice: Subject to any disclaimer, the term of this patent is extended or adjusted under 35 U.S.C. 154(b) by 210 days.

(21) Appl. No.: 10/776,615

(22) Filed: Feb. 12, 2004

(65) Prior Publication Data

US 2004/0161009 A1   Aug. 19, 2004

(30) Foreign Application Priority Data

Feb. 13, 2003 (JP) ............... P2003-035366
Jul. 14, 2003 (JP) ............... P2003-274306

(51) Int. Cl.
*H01S 5/00* (2006.01)
(52) U.S. Cl. ............... 372/45.012; 372/45.01
(58) Field of Classification Search ........... 372/45.012, 372/45.01
See application file for complete search history.

(56) References Cited

U.S. PATENT DOCUMENTS

| | | | | |
|---|---|---|---|---|
| 6,560,259 | B1 * | 5/2003 | Hwang | 372/45.01 |
| 6,621,842 | B1 * | 9/2003 | Dapkus | 372/45.01 |
| 6,849,866 | B2 * | 2/2005 | Taylor | 257/24 |
| 2002/0075920 | A1 * | 6/2002 | Spruytte et al. | 372/45 |
| 2004/0161006 | A1 * | 8/2004 | Chang et al. | 372/45 |

OTHER PUBLICATIONS

"Cascade" Merriam-Webster Online accessed on Aug. 1, 2006 at (http://m-w.com/dictionary/cascade).*
Bellaiche et al., "Localization and Percolation in Semiconductor Alloys: GaAsN vs GaAsP", Physical Review B, vol. 54, No. 24, Dec. 15, 1996, pp. 17568-17576.
Sirtori et al., "Low-loss Al-free Waveguides for Unipolar Semiconductor Lasers", Applied Physics Letters, vol. 75, No. 25, pp. 3911-3913, Dec. 20, 1999.

* cited by examiner

*Primary Examiner*—Minsun Harvey
*Assistant Examiner*—Marcia A. Golub
(74) *Attorney, Agent, or Firm*—Drinker Biddle & Reath LLP

(57) ABSTRACT

A quantum cascade laser 1, which generates infrared light or other light of a predetermined wavelength by making use of intersubband transitions in a quantum well structure, is arranged by forming, on a GaAs substrate 10, an AlGaAs/GaAs active layer 11 having a cascade structure in which quantum well light emitting layers and injection layers are laminated alternately. Also, at the GaAs substrate 10 side and the side opposite the GaAs substrate 10 side of active layer 11, is provided a waveguide structure, comprising waveguide core layers 12 and 14, each being formed of an n-type GaInNAs layer, which is a group III-V compound semiconductor that contains N (nitrogen), formed so as to be lattice matched with the GaAs substrate 10, and waveguide clad layers 13 and 15, each formed of an $n^{++}$-type GaAs layer. A quantum cascade laser, with which the waveguide loss of generated light in the laser is reduced, is thereby realized.

3 Claims, 19 Drawing Sheets

Fig.9

| | LAYER COMPOSITION | THICKNESS(nm) | CARRIER DENSITY (cm$^{-3}$) |
|---|---|---|---|
| INJECTION LAYERS | GaInNAs | 2.1 | UNDOPE |
| | AlGaAs | 2.5 | UNDOPE |
| | GaInNAs | 2.3 | $1.6 \times 10^{17}$ |
| | AlGaAs | 2.5 | $1.6 \times 10^{17}$ |
| | GaInNAs | 2.3 | $1.6 \times 10^{17}$ |
| | AlGaAs | 2.3 | $1.6 \times 10^{17}$ |
| | GaInNAs | 2.8 | UNDOPE |
| | AlGaAs | 2.0 | UNDOPE |
| | GaInNAs | 3.2 | UNDOPE |
| QUANTUM WELL LIGHT EMITTING LAYERS | AlGaAs | 3.4 | UNDOPE |
| | GaInNAs | 4.0 | UNDOPE |
| | AlGaAs | 1.7 | UNDOPE |
| | GaInNAs | 4.9 | UNDOPE |
| | AlGaAs | 2.0 | UNDOPE |
| | GaInNAs | 1.5 | UNDOPE |
| | AlGaAs | 5.8 | UNDOPE |

Fig.12 PRIOR ART

|  | LAYER COMPOSITION | THICKNESS(nm) | CARRIER DENSITY (cm$^{-3}$) |
|---|---|---|---|
| INJECTION LAYERS | GaAs | 2.1 | UNDOPE |
|  | AlGaAs | 2.5 | UNDOPE |
|  | GaAs | 2.3 | $1.6 \times 10^{17}$ |
|  | AlGaAs | 2.5 | $1.6 \times 10^{17}$ |
|  | GaAs | 2.3 | $1.6 \times 10^{17}$ |
|  | AlGaAs | 2.3 | $1.6 \times 10^{17}$ |
|  | GaAs | 2.8 | UNDOPE |
|  | AlGaAs | 2.0 | UNDOPE |
|  | GaAs | 3.2 | UNDOPE |
| QUANTUM WELL LIGHT EMITTING LAYERS | AlGaAs | 3.4 | UNDOPE |
|  | GaAs | 4.0 | UNDOPE |
|  | AlGaAs | 1.7 | UNDOPE |
|  | GaAs | 4.9 | UNDOPE |
|  | AlGaAs | 2.0 | UNDOPE |
|  | GaAs | 1.5 | UNDOPE |
|  | AlGaAs | 5.8 | UNDOPE |

QUANTUM CASCADE LASER

BACKGROUND OF THE INVENTION

1. Field of the Invention

This invention concerns a quantum cascade laser that makes use of intersubband transitions in a quantum well structure.

2. Related Background Art

Light of the middle infrared wavelength range (for example, wavelengths of 3 to 10 μm) is deemed important in various fields, such as medical fields, biomedical measurement, environmental measurement, etc. There are thus increasing needs for a high-performance coherent light source for this wavelength range.

However, a laser light source using normal interband transitions operates only at low temperature in the middle infrared range, and a laser light source capable of operation under room temperature, continuous (CW) emission operation, or high output operation, etc., has not been realized. The realization of a high-performance laser light source that can take the place of carbon dioxide gas lasers, which have been used since priorly as coherent light sources for the infrared range, solid-state lasers, which use wavelength conversion optical crystals, free-electron lasers, which accompany large-scale facilities, etc., (see for example, the literature, C. Sirtori et al., "Low-loss Al-free waveguides for unipolar semiconductor lasers", Appl. Phys. Lett. vol. 75 (1999) pp. 3911-3913.) is to be hoped.

SUMMARY OF THE INVENTION

The development of quantum cascade lasers as infrared light emitting elements making use of semiconductor materials has been progressing in recent years. A quantum cascade laser is a laser light source that generates light by making use of intersubband transitions in a quantum well structure with low temperature dependence, and, in principle, can generate light in the wavelength range of approximately 3 to 70 μm.

Also with a quantum cascade laser, a high output is enabled by a cascade structure in which quantum well light emitting layers are disposed in multiple layers. A quantum cascade laser furthermore has great potential as an infrared coherent light source due to being a unipolar device that makes use of intersubband transitions as mentioned above and not having a PN junction, being able to generate ultrashort pulse light at a frequency response of high speed, being small in relaxation oscillation, enabling multiple wavelength emission and broadband emission, and being excellent in temperature characteristics.

As such a quantum well cascade laser, a quantum cascade laser (InP-QCL) using an InP substrate as the semiconductor substrate is mainly known. A quantum cascade laser (GaAs-QCL) that uses a GaAs substrate, which is more inexpensive and better in crystal properties than InP, has also been developed. For example, a quantum cascade laser (GaAs-QCL) that uses a GaAs substrate as the semiconductor material of the substrate is disclosed in the abovementioned literature. With the GaAs-QCL described in this literature, the active layer is arranged from a GaAs/AlGaAs layer, and between the GaAs substrate and the active layer, a waveguide clad layer ($n^{++}$-type GaAs layer) and a waveguide core layer (n-type GaAs layer) are disposed in that order from the GaAs substrate side. It is reported that laser emission of a wavelength of 9 μm was achieved at a temperature of 77K by this arrangement.

When such a quantum cascade laser is to be used as an infrared laser light source, the optical loss due to waveguide loss within the laser, etc., becomes a problem since the infrared light that is generated is of long wavelength. That is, in a waveguide structure inside a laser in which infrared light is guided, the light undergoes free carrier absorption at an absorption coefficient α, expressed by the following equation.

$$\alpha = Ne^2\lambda^2/(\pi n c^3 m^* \tau)$$

In this equation, N is the carrier density, e is the unit charge, λ is the wavelength of light, n is the refractive index, c is the speed of light, m* is the effective mass of an electron inside the waveguide, and τ is the relaxation time.

As can be understood from this equation, the free carrier absorption that occurs in the waveguide structure inside a laser increases in proportion with the square of the wavelength λ of light. The waveguide loss of generated light, due to free carrier absorption inside the laser, is thus problem in a quantum cascade laser that generates infrared light of a long wavelength.

This invention has been made to resolve the above problem and an object thereof is to provide a quantum cascade laser, with which the waveguide loss of generated light within the laser is lessened.

In order to achieve the above object, a quantum cascade laser by this invention comprises: (1) an active layer, having a cascade structure, in which quantum well light emitting layers and injection layers are laminated alternately on a semiconductor substrate formed of GaAs, and generating light by intersubband transitions in a quantum well structure; (2) a waveguide core layer, formed adjacent the active layer; and (3) a waveguide clad layer, formed adjacent the waveguide core layer at the side opposite the side of the active layer; and wherein (4) the waveguide core layer is formed of a group III-V compound semiconductor, containing, as the group V elements, N and at least one element selected from the group consisting of As, P, and Sb, and formed so as to be lattice matched with the semiconductor substrate.

This invention also provides a quantum cascade laser comprising: (1) an active layer, having a cascade structure, in which quantum well light emitting layers and injection layers are laminated alternately on a semiconductor substrate formed of InP, and generating light by intersubband, transitions in a quantum well structure; (2) a waveguide core layer, formed adjacent the active layer; and (3) a waveguide clad layer, formed adjacent the waveguide core layer at the side opposite the side of the active layer; and wherein (4) the waveguide core layer is formed of a group III-V compound semiconductor, containing, as the group V elements, N and at least one element selected from the group consisting of As, P, and Sb, and formed so as to be lattice matched with the semiconductor substrate.

With the above-described quantum cascade laser, in the waveguide structure for the active layer in which quantum well light emitting layers are disposed in multiple stages with injection layers in between, a waveguide core layer, for guiding the infrared light or other light generated inside the laser, is formed using a group III-V compound semiconductor, containing N (nitrogen) as the group V element.

With an arrangement in which the core layer is formed of such a semiconductor material, the waveguide loss of generated light, due to free carrier absorption inside the laser, is reduced. Also with this waveguide structure, the effective refractive index of the waveguide core layer increases. The thickness of the waveguide core layer and clad layer necessary for light containment can thereby be made thin.

Here, the waveguide core layer is preferably formed to a predetermined thickness that is set so that optical modes of higher orders will not be guided. By doing so, the light generated inside the laser can be guided and output satisfactorily.

Also, the waveguide clad layer preferably contains a high-concentration doped layer formed of a group III-V compound semiconductor, containing, as the group V elements, N and at least one element selected from the group consisting of As, P, and Sb. The light generated inside the laser is thereby restrained from leaking to the plasmon mode.

This invention also provides a quantum cascade laser comprising: a semiconductor substrate formed of GaAs; and an active layer, disposed on the semiconductor substrate and having a plurality of quantum well light emitting layers, generating light by means of intersubband transitions in a quantum well structure, and a plurality of injection layers, respectively disposed between the plurality of quantum well light emitting layers and forming a cascade structure along with the quantum well light emitting layers; and wherein the quantum well light emitting layers and the injection layers of the active layer are formed to contain group III-V compound semiconductors, each containing, as the group V elements, N (nitrogen) and at least one element selected from the group consisting of As, P, and Sb.

In the case of a GaAs-QCL, which uses a GaAs substrate as the semiconductor substrate, ultrafine processing using a process technology, such as dry etching, etc., can be applied and thus even higher performance and higher functions can be anticipated. A GaAs substrate is also excellent in terms of cost since inexpensive raw materials can be used. Also with regard to pulsed operation, GaAs-QCL's far surpasses InP-QCL's in peak output. GaAs-QCL's thus have various excellent characteristics over InP-QCL's and the making of GaAs-QCL's high in performance (for example, the realization of continuous (CW) emission at high temperature) is being desired.

Meanwhile, a semiconductor laser that emits light of a wavelength in the infrared range generally requires a cooling device. This is because energy gap transitions that are smaller than those of a semiconductor laser that emits light of a wavelength in the visible range are used and the sensitivity to the heat distribution of carriers is thus extremely high. Even a quantum cascade laser requires cooling for CW operation and thus requires a cooling device. Cooling becomes especially necessary when the self-heating by the element itself is high.

Here, with the prior-art GaAs-QCL arrangement described in the abovementioned literature, in order to reduce the free carrier absorption inside the waveguide clad layer and the waveguide loss inside the laser due thereto, the intensity of light must be attenuated adequately before the waveguide clad layer is reached and thus the thickness of the waveguide core layer must be made adequately thick. There is thus the problem that self-heating becomes high due to increased element resistance of a GaAs-QCL in the case where the GaAs-QCL is to perform CW emission at a high temperature, etc.

On the other hand, with the quantum cascade laser of the above-described arrangement, the effective refractive index of the active layer can be made greater than that of the semiconductor substrate formed of GaAs. The semiconductor substrate can thereby be made to function as a waveguide clad layer and the active layer can be made to function as a waveguide core layer. The waveguide loss of generated light, due to free carrier absorption inside the laser, can thus be reduced by such an arrangement. Also in this case, since the thickness of the element can be made thin, the element resistance can be reduced and self-heating of the element due to the element resistance can be restrained. The layer structure between the semiconductor substrate and the active layer can also be simplified.

With the above-described quantum cascade laser, the composition ratio of N in the group III-V compound semiconductor is preferably no less than 0.1% and no more than 40%. By the composition ratio of nitrogen being no less than 0.1%, the containment of light in the active layer can be made definite. Also, by the composition ratio of nitrogen being no more than 40%, the band gap can be made small.

Furthermore, the above-described cascade laser is preferably equipped with a semiconductor layer formed adjacent the active layer, disposed at least either between the semiconductor substrate and the active layer or at the side of the active layer opposite the semiconductor substrate side and formed of a group III-V compound semiconductor, containing, as the group V elements, N and at least one element selected from the group consisting of As, P, and Sb. In this case, the abovementioned semiconductor layer and the active layer can be made to function as a whole as a core layer. And since the effective refractive index of this core layer can be made greater than the refractive index of the semiconductor substrate formed of GaAs or furthermore greater than the effective refractive index of the active layer, light containment can be strengthened further.

The present invention will be more fully understood from the detailed description given hereinbelow and the accompanying drawings, which are given by way of illustration only and are not be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

BRIEF DESCRIPTION OF THE DRAWINGS

FIG. 9 is a table showing an example of the thickness, order of lamination, and carrier concentrations of the respective layers of the laminated units that form an active layer.

FIG. 12 is a table showing an example of the thickness, order of lamination, and carrier concentrations of the respective layers of the laminated units that form an active layer.

DESCRIPTION OF THE PREFERRED EMBODIMENTS

Preferred embodiments of this invention's quantum cascade laser shall now be described in detail along with the drawings. In the description of the drawings, the same elements shall be provided with the same symbols and redundant description shall be omitted. The dimensions and proportions of the drawings may not necessarily match those of the description.

Figure 1:
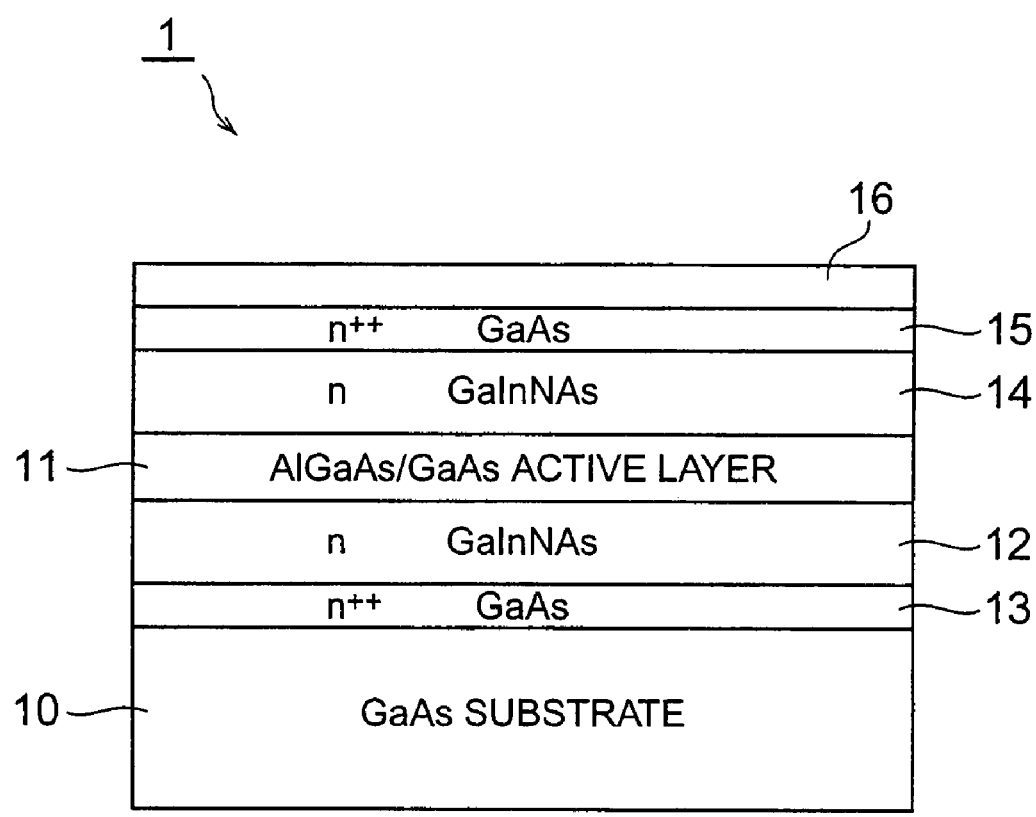
FIG. 1 is a sectional side view showing the arrangement of a first embodiment of a quantum cascade laser.

FIG. 1 is a sectional side view showing the arrangement of a first embodiment of this invention's quantum cascade laser. Laser 1, shown in FIG. 1, is an AlGaAs/GaAs type quantum cascade laser (GaAs-QCL) that uses GaAs as the semiconductor material of the substrate.

Quantum cascade laser 1 comprises a GaAs substrate (semiconductor substrate) 10, and the respective semiconductor layers of an active layer 11, waveguide core layers 12 and 14, and waveguide clad layers 13 and 15, which are formed on GaAs substrate 10. Also, of the side surfaces of quantum cascade laser 1, mirror surfaces, which form the optical resonator of this laser 1, are formed on two predetermined surfaces that oppose each other.

Active layer 11 is a semiconductor layer that is formed on GaAs substrate 10 and generates light of a predetermined wavelength (for example, light in the middle infrared wavelength range) by making use of intersubband transitions in a quantum well structure. In the present embodiment, in correspondence to the use of GaAs substrate 10 as the semiconductor substrate as mentioned above, active layer 11 is arranged as an AlGaAs/GaAs multiple quantum well structure that uses GaAs in quantum well layers and uses AlGaAs in quantum barrier layers.

Specifically, active layer 11 is formed, by quantum well light emitting layers (quantum well active layers) and injection layers being laminated alternately, to have a cascade structure in which the quantum well light emitting layers are disposed in multiple stages. The number of quantum well light emitting layers and injection layers laminated are set suitably and is, for example, approximately a few hundred.

Figure 2:
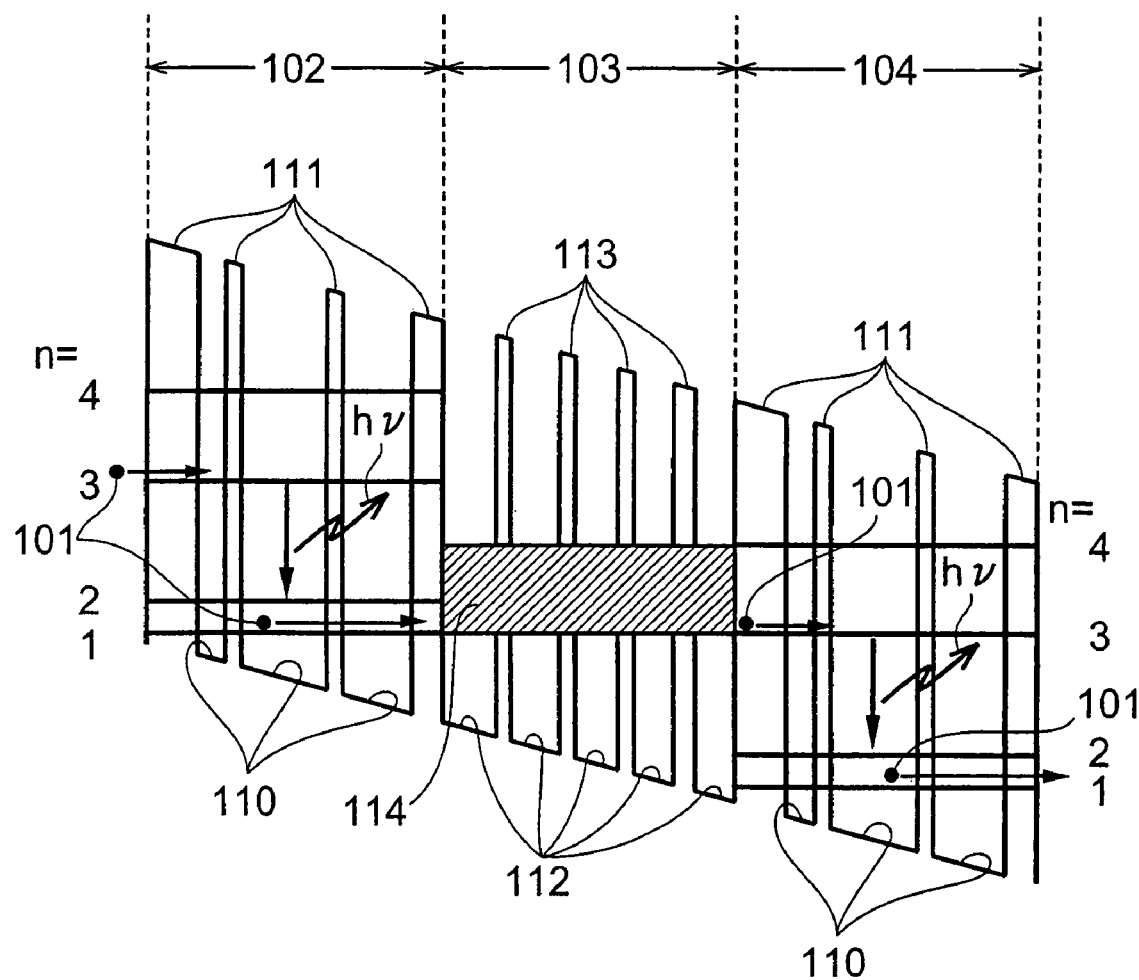
FIG. 2 is a diagram showing a cascade structure and intersubband transitions in a quantum well structure of an active layer.

FIG. 2 is a diagram showing the cascade structure and the intersubband transitions in the quantum well structure of the active layer. For the sake of description, in FIG. 2, among the laminated structure of the quantum well light emitting layers and injection layers that form active layer 11, the cascade structure of three layers, that is, the two quantum well light emitting layers 102 and 104 and the single injection layer 103, sandwiched between light emitting layers 102 and 104, is shown.

As shown in FIG. 2, each of quantum well light emitting layers 102 and 104 is formed of quantum well layers 110 and quantum barrier layers 111. In each of light emitting layers 102 and 104, quantum levels n=1, 2, and 3 are formed by these quantum well layers 110 and quantum barrier layers 111.

Also, injection layer 103 is disposed between light emitting layers 102 and 104. This injection layer 103 is formed of quantum well layers 112 and quantum barrier layers 113, and quantum well layers 112 are formed to become narrower in width in the direction from light emitting layer 102 to light emitting layer 104.

When a bias voltage is applied to quantum cascade laser 1, having active layer 11 with such a conduction band quantum level structure, electrons 101 become injected selectively into the quantum level of n=3 of light emitting layer 102. An electron 101 that is injected into the quantum level of n=3 transits to the quantum level of n=2, and in this process, light hv of a wavelength corresponding to the energy level difference between the quantum levels of n=2 and 3 is generated.

Also, the electron 101 that has transited to the quantum level of n=2 passes from the quantum level of n=2 through injection layer 103 and is selectively injected into the quantum level of n=3 of light emitting layer 104. This electron 101 then transits from the quantum level of n=3 to the quantum level of n=2 in light emitting layer 104. In this process, light hv of a wavelength corresponding to the energy level difference between the quantum levels of n=2 and 3 is generated.

When for example the energy gap between the quantum level of n=3 and the quantum level of n=2 is approximately 300 meV in both cases, the wavelength of the light hv that is emitted from each of light emitting layers 102 and 104 will be of the middle infrared wavelength range. Light of such wavelength is resonated by the optical resonator of laser 1 and output as laser light of a predetermined wavelength. When a plurality of such quantum well light emitting layers and injection layers are laminated alternately, electrons move successively in a cascading manner among the quantum well light emitting layers and light hv is generated in the process of the intersubband transition at each light emitting layer.

For active layer 11, having the cascade structure shown in FIG. 2, n-type waveguide core layers 12 and 14, which are low-concentration doped layers, and n++-type waveguide clad layers 13 and 15, which are high concentration doped layers, are disposed to form a waveguide structure by which the light generated in active layer 11 is guided inside laser 1.

At the GaAs substrate 10 side (lower side in the Figure) of active layer 11, waveguide core layer 12 and waveguide clad layer 13 are formed in that order from the active layer 11 side. Waveguide core layer 12 is a semiconductor layer formed of an n-type GaInNAs layer and is formed to be adjacent to active layer 11 and be lattice matched with GaAs substrate 10.

Waveguide clad layer 13 is a semiconductor layer formed of an $n^{++}$-type GaAs layer and is formed adjacent waveguide core layer 12 at the side opposite the side of active layer 11. With such an arrangement, the refractive index of waveguide core layer 12 is higher than those of the adjacent active layer 11 and waveguide clad layer 13. A waveguide structure comprising core layer 12 and clad layer 13 is thus arranged.

Also at the side opposite the GaAs substrate 10 side (upper side in the Figure) of active layer 11, waveguide core layer 14 and waveguide clad layer 15 are formed in that order from the active layer 11 side. Waveguide core layer 14 is a semiconductor layer formed of an n-type GaInNAs layer and is formed to be adjacent to active layer 11 and be lattice matched with GaAs substrate 10.

Waveguide clad layer 15 is a semiconductor layer formed of an $n^{++}$-type GaAs layer and is formed adjacent waveguide core layer 14 at the side opposite the side of active layer 11. With such an arrangement, the refractive index of waveguide core layer 14 is higher than those of the adjacent active layer 11 and waveguide clad layer 15. A waveguide structure comprising core layer 14 and clad layer 15 is thus arranged.

A contact layer 16 is furthermore formed at the upper side of waveguide clad layer 15. By the above, quantum cascade laser 1, in which $n^{++}$-type GaAs clad layer 13, n-type GaInNAs core layer 12, AlGaAs/GaAs active layer 11, n-type GaInNAs core layer 14, $n^{++}$-type GaAs clad layer 15, and contact layer 16 are laminated in that order onto GaAs substrate 10, is arranged. The typical thickness and carrier concentrations of the respective semiconductor layers are as follows.

TABLE 1

| | Thickness | Carrier concentration |
|---|---|---|
| $n^{++}$-type GaAs waveguide clad layer 15 | 1 μm | $n = 6 \times 10^{18}$ cm$^{-3}$ |
| n-type GaInNAs waveguide core layer 14 | 2.20 μm | $n = 4 \times 10^{16}$ cm$^{-3}$ |
| AlGaAs/GaAs active layer 11 | 1.63 μm | Undope |
| n-type GaInNAs waveguide core layer 12 | 2.20 μm | $n = 4 \times 10^{16}$ cm$^{-3}$ |
| $n^{++}$-type GaAs waveguide clad layer 13 | 1 μm | $n = 6 \times 10^{18}$ cm$^{-3}$ |

The effects of the quantum cascade laser of the above-described embodiment shall now be described.

With quantum cascade laser 1 shown in FIG. 1, active layer 11, having a cascade structure in which quantum well light emitting layers are disposed in multiple stages with injection layers in between, is provided with the waveguide structure wherein GaInNAs, which is a group III-V compound semiconductor containing N (nitrogen) as the group V element, is used to form waveguide core layers 12 and 14, which are adjacent active layer 11 and in which infrared light or other light generated inside laser 1 is guided. With an arrangement in which core layers 12 and 14 are formed from such a semiconductor material, the waveguide loss of generated light, due to free carrier absorption inside laser 1, is reduced.

Figure 3:
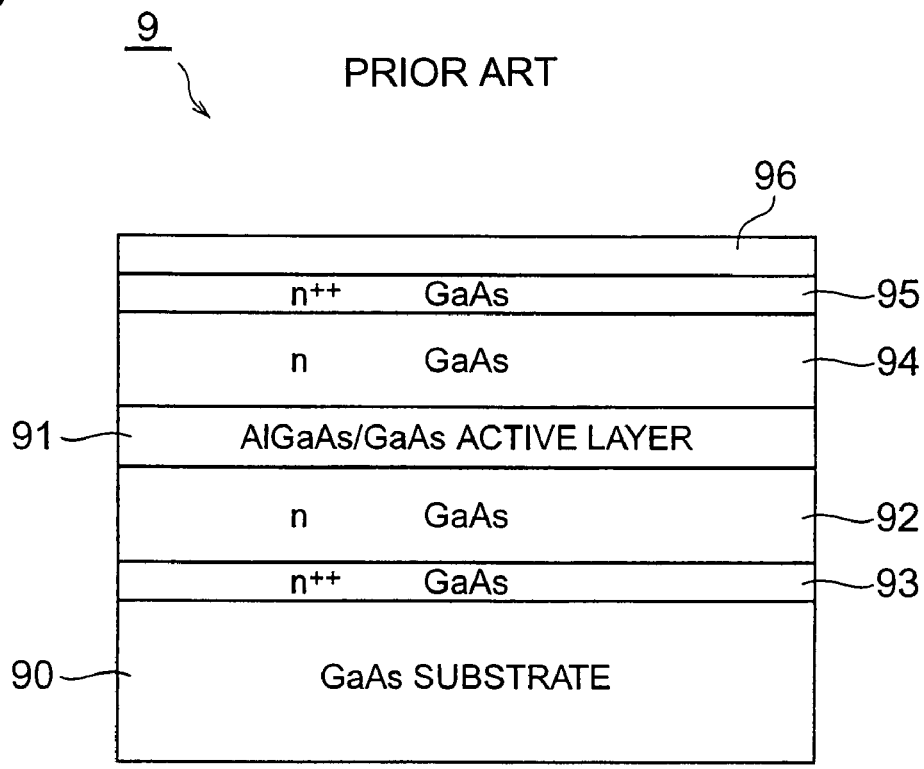
FIG. 3 is a sectional side view showing an example of the arrangement of a prior-art quantum cascade laser.

FIG. 3 is a sectional side view showing an example of the arrangement of a prior-art quantum cascade laser. Laser 9, which is shown in FIG. 3, is an AlGaAs/GaAs type quantum cascade laser that uses a GaAs substrate.

Quantum cascade laser 9 is arranged by laminating an $n^{++}$-type GaAs clad layer 93, an n-type GaAs core layer 92, an AlGaAs/GaAs active layer 91, an n-type GaAs core layer 94, an $n^{++}$-type GaAs clad layer 95, and a contact layer 96 in that order onto a GaAs substrate 90.

Unlike quantum cascade laser 1, shown in FIG. 1, with quantum cascade laser 9, GaAs is used as the semiconductor material of waveguide core layers 92 and 94, which are adjacent active layer 91. Also, though the typical thickness and carrier concentrations of the respective semiconductor layers are substantially the same as those shown in Table 1 for quantum cascade laser 1, with the present example, the thickness of each of n-type GaAs core layers 92 and 94 is set to a somewhat thick value of 3.5 μm.

With quantum cascade laser 9 with such an arrangement, waveguide loss of light generated in active layer 91, due to free carrier absorption inside waveguide core layers 92 and 94, becomes a problem, and for example, continuous emission under room temperature has not been achieved even with the quantum cascade laser described in the literature of C. Sirtori et al. Here, as indicated by the equation of the absorption coefficient α, the free carrier absorption in the waveguide structure inside a laser decreases in inverse proportion to the effective mass of an electron inside the waveguide. Thus in order to reduce the waveguide loss due to free carrier absorption, it is preferable to use a semiconductor material that will make the effective electron mass large in the waveguide core layers.

Meanwhile, with quantum cascade laser 1 shown in FIG. 1, GaInNAs, which contains N and is lattice matched with GaAs, is used as the semiconductor material of waveguide core layers 12 and 14. The effective electron masses and the light absorption coefficients in a waveguide core layer using GaAs and in a waveguide core layer using GaInNAs with an added amount of N of 1.5% are shown in Table 2.

TABLE 2

| | GaAs | GaInNAs, N = 1.5% |
|---|---|---|
| Effective mass | $0.067 \times m_0$ | $0.097 \times m_0$ |
| Absorption coefficient | 1 (Unity) | 0.69 |

Here, $m_0$ indicates the mass of a free electron. Also, absorption coefficients are shown with the absorption coefficient of the waveguide core layer using GaAs being set to 1. As shown in Table 2, the effective electron mass inside a waveguide is made greater with the arrangement in which a group III-V compound semiconductor, containing N, is used as the semiconductor material of the waveguide core layers in a GaAs-QCL that uses a GaAs substrate.

In this case, the free carrier absorption inside the waveguide core layers is made small and the waveguide loss of generated light inside the laser is reduced. With the example shown in Table 2 in which the added amount of N is set to 1.5%, the light absorption coefficient due to free carrier absorption in the GaInNAs waveguide core layer is reduced to 0.69 times that of the prior-art GaAs waveguide core layer.

Also with a quantum cascade laser that generates infrared light, etc., since the light that is generated is of a long wavelength, light containment inside the laser is difficult and it has been noted that the waveguide core layers and clad layers must be made thick in order to obtain an adequate light containment effect. However, when the waveguide layers are thus made thick, the serial resistance of the laser element increases. This increase of serial resistance becomes a problem especially with infrared semiconductor lasers, which often require cooling.

Meanwhile, the N-containing GaInNAs, which is used in waveguide core layers 12 and 14 of quantum cascade laser 1 shown in FIG. 1, is a semiconductor material that is greater in refractive index than GaAs. The refractive indices and thickness (μm) required for adequate light containment are shown in Table 3 for a waveguide core layer using GaAs and a waveguide core layer using GaInNAs with an added amount of N of 1.5%.

TABLE 3

|  | GaAs | GaInNAs, N = 1.5% |
| --- | --- | --- |
| Refractive index | 3.265 | 3.45 |
| Required thickness (μm) | 3.50 | 2.20 |

As shown in this Table 3, by replacing the GaAs, used priorly in the waveguide core layers of a GaAs-QCL, by GaInNAs, the effective refractive index of the core layer is increased. The thickness of the waveguide core layers and clad layers required for adequate light containment can thus be made thin. With the example shown in Table 3 in which the added amount of N is set to 1.5%, the core layer thickness of the GaInNAs waveguide core layer is reduced to 0.63 times that of the prior-art GaAs waveguide core layer. Also, by such reduction of the core layer thickness, the serial resistance of the laser element is reduced.

Furthermore with regard to the thickness of such waveguide core layers 12 and 14, waveguide core layers 12 and 14 are preferably formed to a predetermined thickness that has been set so that optical modes of higher orders will not be guided. By doing so, the light generated inside the laser can be guided and output satisfactorily.

In general, the waveguide core layers applied to a quantum cascade laser arranged using a GaAs substrate are preferably formed of a group III-V compound semiconductor, containing N and at least one element among As, P, and Sb as the group V elements, and formed so as to be lattice matched with the GaAs substrate. By such an arrangement, the waveguide loss due to free carrier absorption can be reduced as described above and the core layer thickness required for light containment can be reduced.

With regard to the amount of N added to the group III-V compound semiconductor used in the waveguide core layers, an added amount of 10% or less is preferable for keeping the characteristics of the wave guide core layers favorable.

As described above, with quantum cascade laser 1 of the arrangement shown in FIG. 1, since the free carrier absorption inside the waveguide core layers is reduced and the waveguide core layers can be made thin, the temperature characteristics of the laser element is improved and operation at a high temperature (for example, room temperature) is made possible. Also, since the waveguide core layers made low in loss, a quantum cascade laser of high output is realized.

Also by the thinning of the waveguide core layers, the element resistance is reduced. Continuous (CW) emission at a high temperature is thus also enabled. Such effects are furthermore enhanced as the light generated by the laser becomes longer in wavelength. The realization of a laser light source of even longer wavelength range, for example, a high-output quantum cascade laser of the terahertz band is thus also made possible.

Also with quantum cascade laser 1, shown in FIG. 1, $n^{++}$-type high-concentration doped layers are used as waveguide clad layers 13 and 15. By arranging a waveguide clad layer to contain such a high-concentration doped layer, the real part of the refractive index of the waveguide clad layer is reduced significantly, thereby enabling improvement of the light containment effect in the waveguide structure. By such improvement of the light containment effect, high-loss leakage of light into the plasmon mode, which occurs at a metal electrode—semiconductor interface, etc., can be restrained.

Quantum cascade laser 1, having the arrangement shown in FIG. 1, may for example be prepared using a gas source MBE (Molecular Beam Epitaxy) method. With this method, $n^{++}$-type GaAs clad layer 13, n-type GaInNAs core layer 12, which is lattice matched with GaAs substrate 10, AlGaAs/GaAs active layer 11, in which quantum well light emitting layers and injection layers are laminated, n-type GaInNAs core layer 14, which is lattice matched with GaAs substrate 10, and $n^{++}$-type GaAs clad layer 15 can be grown successively on top of GaAs substrate 10 to form the laminated structure of quantum cascade laser 1.

Here, though the GaAs layer and the AlGaAs layer may be grown at a conventional growth temperature, that is, at around 600° C., the GaInNAs layer is preferably grown at approximately 450° C. in consideration of the phase separation of In. Also, the high-concentration doped GaAs layers that are to become waveguide clad layers 13 and 15 may be formed using Si, for example, as the dopant.

Figure 4:
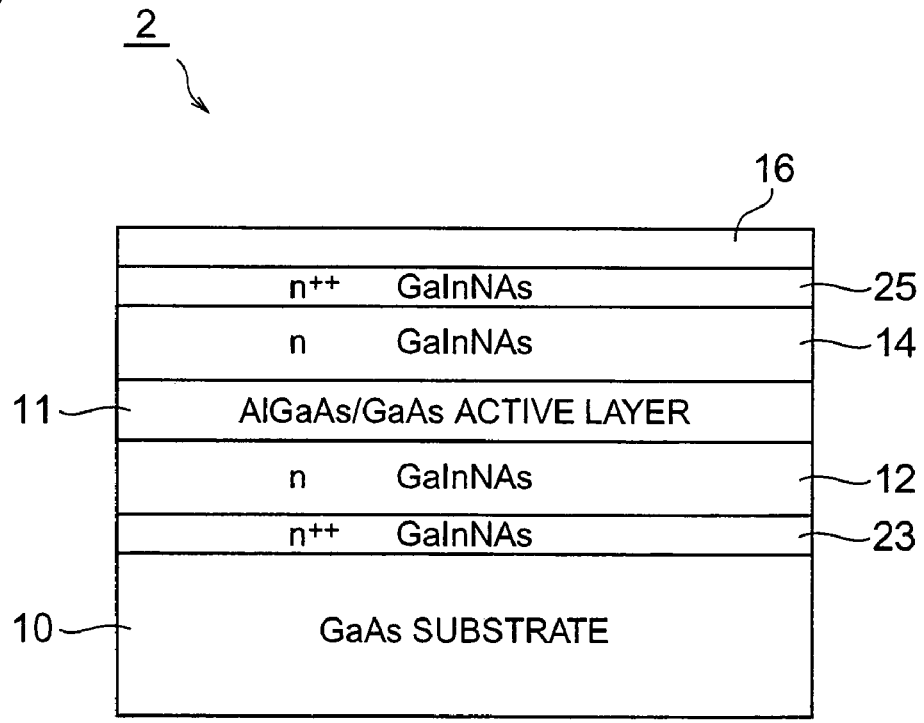
FIG. 4 is a sectional side view showing the arrangement of a second embodiment of a quantum cascade laser.

FIG. 4 is a sectional side view showing the arrangement of a second embodiment of this invention's quantum cascade laser. As with laser 1 shown in FIG. 1, laser 2, shown in FIG. 4, is an AlGaAs/GaAs type quantum cascade laser that uses a GaAs substrate.

Quantum cascade laser 2 is arranged by laminating an $n^{++}$-type GaInNAs clad layer 23, n-type GaInNAs core layer 12, AlGaAs/GaAs active layer 11, n-type GaInNAs core layer 14, $n^{++}$-type GaInNAs clad layer 25, and contact layer 16 in that order onto GaAs substrate 10.

This quantum cascade laser 2 has substantially the same arrangement as quantum cascade laser 1 shown in FIG. 1. However, $n^{++}$-type GaInNAs layers 23 and 25 are used in place of $n^{++}$-type GaAs layers as the waveguide clad layers adjacent the waveguide core layers 12 and 14. The typical thickness and carrier concentrations of the respective semiconductor layers are the same as those shown in Table 1 for quantum cascade laser 1.

High-concentration doped layers, having the same N-containing group III-V compound semiconductor as that of waveguide core layers 12 and 14 as the semiconductor material, may thus be used as the waveguide clad layers. Here, the high-concentration doped layer in the waveguide clad layer is effective for improving the light containment effect in the waveguide structure and restraining the leakage of light into the plasmon mode as mentioned above. On the other hand, such a high-concentration doped layer may be a cause of increase of free carrier absorption.

However, an N-containing semiconductor material, such as GaInNAs, has the property that the effective electron mass inside a GaInNAs layer increases rapidly in accordance with the doping quantity. Thus by changing the waveguide clad layers from GaAs layers to GaInNAs layers, further reduction of the free carrier absorption is enabled. High-concentration doping into GaInNAs may be achieved using a dopant, such as Si, Se, Te, etc.

Generally as such a waveguide clad layer, it is preferable to use a high-concentration doped layer formed of a group III-V compound semiconductor containing N and at least one element among As, P, and Sb as the group V elements.

Figure 5:
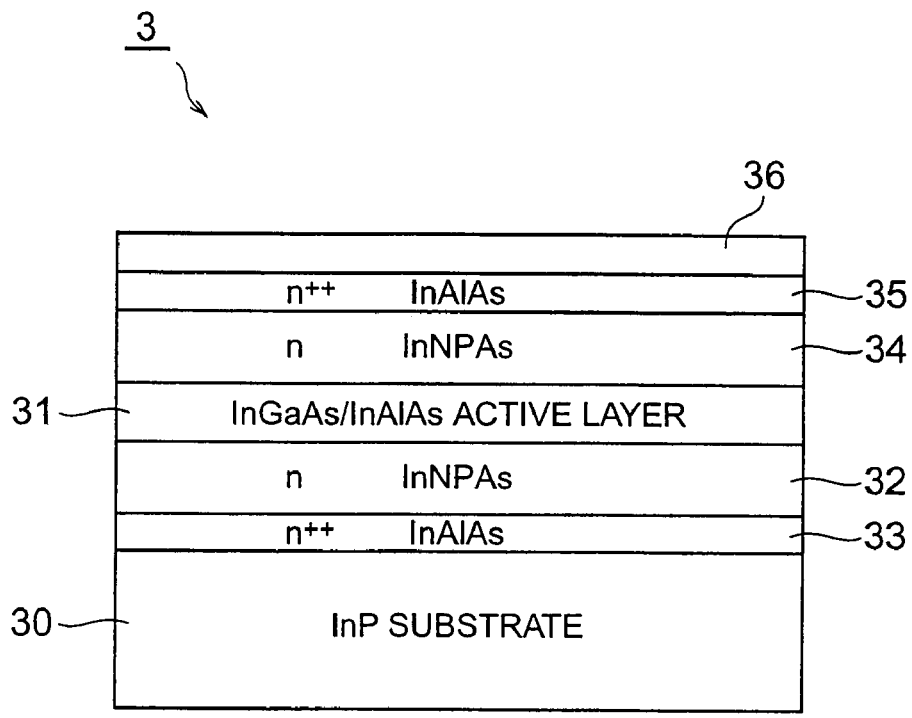
FIG. 5 is a sectional side view showing the arrangement of a third embodiment of a quantum cascade laser.

FIG. 5 is a sectional side view showing the arrangement of a third embodiment of this invention's quantum cascade laser. Laser 3, shown in FIG. 5, is an InGaAs/InAlAs type quantum cascade laser (InP-QCL) that uses InP as the semiconductor material of the substrate.

Quantum cascade laser 3 comprises an InP substrate (semiconductor substrate) 30, and the respective semiconductor layers of an active layer 31, waveguide core layers 32 and 34, and waveguide clad layers 33 and 35 that are formed on InP substrate 30. Also, of the side surfaces of quantum cascade laser 3, mirror surfaces, which form the optical resonator of this laser 3, are formed on two predetermined surfaces that oppose each other.

Active layer 31 is a semiconductor layer that is formed on InP substrate 30 and generates light of a predetermined wavelength (for example, light in the middle infrared wavelength range) by making use of intersubband transitions in a quantum well structure. In the present embodiment, in correspondence to the use of InP substrate 30 as the semiconductor substrate as mentioned above, active layer 31 is arranged as an InGaAs/InAlAs multiple quantum well structure.

Specifically, active layer 31 is formed, by quantum well light emitting layers (quantum well active layers) and injection layers being laminated alternately, to have a cascade structure in which the quantum well light emitting layers are disposed in multiple stages. The cascade structure, the intersubband transitions in the quantum well structure, etc., of active layer 31 are the same as those described in regard to quantum cascade laser 1 shown in FIG. 1.

For active layer 31, with the cascade structure, n-type waveguide core layers 32 and 34, which are low-concentration doped layers, and $n^{++}$-type waveguide clad layers 33 and 35, which are high concentration doped layers, are disposed to form a waveguide structure by which the light generated in active layer 31 is guided inside laser 3.

At the InP substrate 30 side (lower side in the Figure) of active layer 31, waveguide core layer 32 and waveguide clad layer 33 are formed in that order from the active layer 31 side. Waveguide core layer 32 is a semiconductor layer formed of an n-type InNPAs layer and is formed to be adjacent to active layer 31 and be lattice matched with InP substrate 30.

Waveguide clad layer 33 is a semiconductor layer formed of an $n^{++}$-type InAlAs layer and is formed adjacent waveguide core layer 32 at the side opposite the side of active layer 31. In such an arrangement, the refractive index of waveguide core layer 32 is made higher than those of the adjacent active layer 31 and waveguide clad layer 33. A waveguide structure comprising core layer 32 and clad layer 33 is thus arranged.

Also at the side opposite the InP substrate 30 side (upper side in the Figure) of active layer 31, waveguide core layer 34 and waveguide clad layer 35 are formed in that order from the active layer 31 side. Waveguide core layer 34 is a semiconductor layer formed of an n-type InNPAs layer and is formed to be adjacent to active layer 31 and be lattice matched with InP substrate 30.

Waveguide clad layer 35 is a semiconductor layer formed of an $n^{++}$-type InAlAs layer and is formed adjacent waveguide core layer 34 at the side opposite the side of active layer 31. In such an arrangement, the refractive index of waveguide core layer 34 is made higher than those of the adjacent active layer 31 and waveguide clad layer 35. A waveguide structure comprising core layer 34 and clad layer 35 is thus arranged.

A contact layer 36 is furthermore formed at the upper side of waveguide clad layer 35. By the above, quantum cascade laser 3, in which $n^{++}$-type InAlAs clad layer 33, n-type InNPAs core layer 32, InGaAs/InAlAs active layer 31, n-type InNPAs core layer 34, $n^{++}$-type InAlAs clad layer 35, and contact layer 36 are laminated in that order onto InP substrate 30, is arranged. The typical thickness and carrier concentrations of the respective semiconductor layers are the same as those shown in Table 1 for quantum cascade laser 1.

The effects of the quantum cascade laser of the above-described embodiment shall now be described.

With quantum cascade laser 3 shown in FIG. 5, active layer 31, having a cascade structure in which quantum well light emitting layers are disposed in multiple stages with injection layers in between, is provided with the waveguide structure wherein InNPAs, which is a group III-V compound semiconductor containing N (nitrogen) as the group V element, is used to form waveguide core layers 32 and 34, which are adjacent active layer 31 and in which infrared light or other light generated inside laser 3 is guided. With an arrangement in which core layers 32 and 34 are formed from such a semiconductor material, waveguide loss of generated light, due to free carrier absorption inside laser 3, is reduced.

Also, by replacing the InGaAs, used priorly in the waveguide core layers of an InP-QCL, by InNPAs, the effective refractive index of the core layer is increased. The thickness of the waveguide core layers and clad layers required for adequate light containment can thus be made thin.

In general, the waveguide core layers applied to a quantum cascade laser arranged using a InP substrate are preferably formed of a group III-V compound semiconductor, containing N and at least one element among As, P, and Sb as the group V elements, and formed so as to be lattice matched with the InP substrate. By such an arrangement, the waveguide loss due to free carrier absorption can be reduced as described above and the core layer thickness required for light containment can be reduced.

Figure 6:
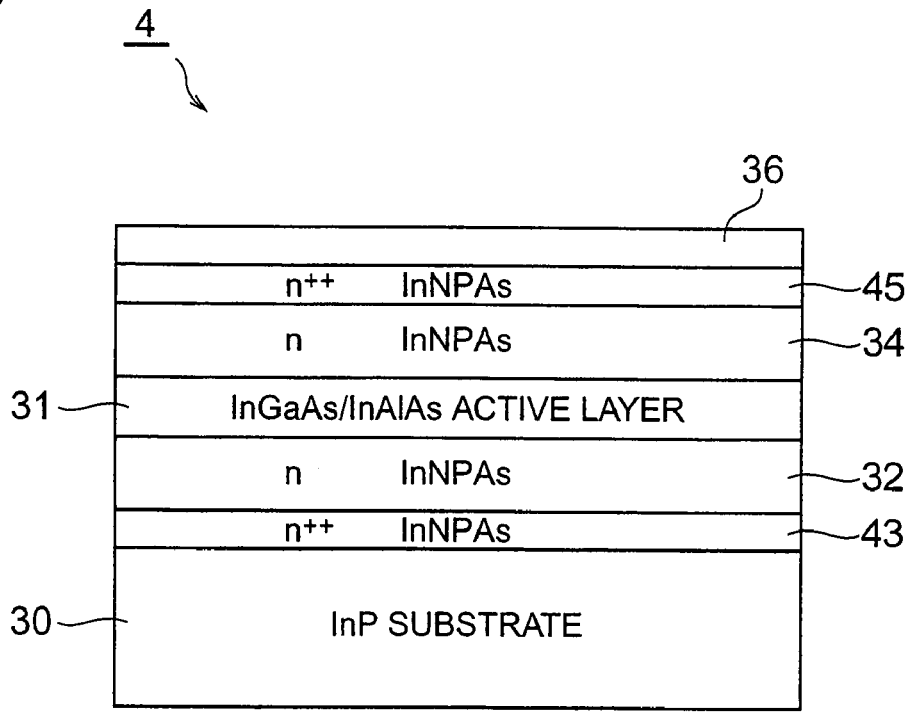
FIG. 6 is a sectional side view showing the arrangement of a fourth embodiment of a quantum cascade laser.

FIG. 6 is a sectional side view showing the arrangement of a fourth embodiment of this invention's quantum cascade laser. As with laser 3 shown in FIG. 5, laser 4, shown in FIG. 6, is an InGaAs/InAlAs type quantum cascade laser that uses an InP substrate.

Quantum cascade laser 4 is arranged by laminating an $n^{++}$-type InNPAs clad layer 43, n-type InNPAs core layer 32, InGaAs/InAlAs active layer 31, n-type InNPAs core layer 34, $n^{++}$-type InNPAs clad layer 45, and contact layer 36 in that order onto InP substrate 30.

This quantum cascade laser 4 has substantially the same arrangement as quantum cascade laser 3 shown in FIG. 5. However, $n^{++}$-type InNPAs layers 43 and 45 are used in place of $n^{++}$-type InAlAs layers as the waveguide clad layers adjacent the waveguide core layers 32 and 34. The typical thickness and carrier concentrations of the respective semiconductor layers are the same as those shown in Table 1 for quantum cascade laser 1.

High-concentration doped layers, having the same N-containing group III-V compound semiconductor as that of waveguide core layers 32 and 34 as the semiconductor material, may thus be used as the waveguide clad layers. Also by changing the waveguide clad layers from InAlAs layers to InNPAs layers, further reduction of free carrier absorption is possible. High-concentration doping into InNPAs may be achieved using a dopant, such as Si, Se, Te, etc.

Generally as such a waveguide clad layer, it is preferable to use a high-concentration doped layer formed of a group III-V compound semiconductor, containing N and at least one element among As, P, and Sb as the group V elements.

This invention's quantum cascade laser is not limited to the above-described embodiments and various modifications are possible. For example, though an example of using a gas source MBE method was indicated in regard to the method of preparing the laminated structure in the quantum cascade laser, the laminated structure may be prepared instead by a solid-state source MBE method, in which a N (nitrogen) source is used as the plasma source, an MOCVD method, etc.

Also, though for example with the quantum cascade laser 1 shown in FIG. 1, n-type GaInNAs core layers 12 and 14 are preferably lattice matched with GaAs substrate 10, since optical characteristics are given priority, some degree of lattice mismatching is tolerable as long as it is within a range that will not influence the laser characteristics excessively.

Also, though with the arrangement examples described above, the composition ranges are those in which the added amount of N in the semiconductor crystal is approximately 1 to 2% and thus extremely low, the above-described effects are expressed more prominently by increasing the added amount of N. Though problems in terms of crystallinity may occur in some cases when the added amount of N is increased, as long as it is within a range in which use as a waveguide layer is enabled, there is no problem in increasing the added amount of N.

This invention's quantum cascade laser shall now be described further.

Figure 7:
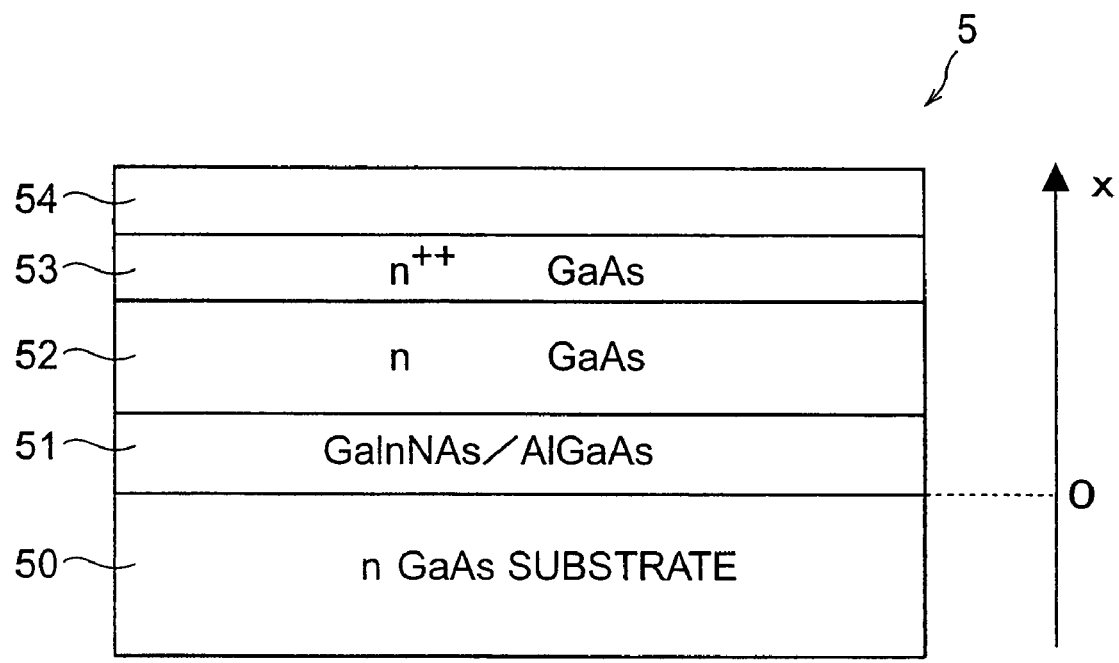
FIG. 7 is a sectional side view showing the arrangement of a fifth embodiment of a quantum cascade laser.

The arrangement of a fifth embodiment of this invention's quantum cascade laser shall now be described with reference to FIGS. 7 and 8. FIG. 7 is a sectional side view showing the arrangement of the quantum cascade laser 5 of the present embodiment. Laser 5, shown in FIG. 7, is a quantum cascade laser that uses GaAs as the semiconductor material of the substrate.

Laser 5 is arranged by successively laminating active layer 51, waveguide clad layer 52, waveguide clad layer 53, and contact layer 54 on top of a GaAs substrate (semiconductor substrate) 50, which is doped to a low concentration of approximately 0.5 to $4 \times 10^{17}$ cm$^{-3}$. Also, of the side surfaces of laser 5, mirror surfaces, which form the optical resonator of this laser 5, are formed on two predetermined surfaces that oppose each other.

Active layer 51 is a semiconductor layer that is formed on GaAs substrate 50 and generates light of a predetermined wavelength (for example, light in the middle infrared wavelength range) by making use of intersubband transitions in a quantum well structure.

Specifically, active layer 51 is formed, by quantum well light emitting layers (quantum well active layers) and injection layers being laminated alternately, to have a cascade structure in which the quantum well light emitting layers are disposed in multiple stages. That is, active layer 51 has a plurality of quantum well light emitting layers and a plurality of injection layers, respectively disposed between the plurality of quantum well light emitting layers and forming a cascade structure. The number of quantum well light emitting layers and injection layers laminated are set suitably, and, for example, in a case where a combination of a quantum well light emitting layer and an injection layer is regarded as a laminated unit, 36 such laminated units are laminated. The thickness of the laminated unit (thickness of the quantum light emitting layer and the injection layer in the lamination direction) is, for example, approximately 45.3 nm. However, the film thickness of the laminated unit and the number of laminated units laminated are not limited to the above.

Figure 8:
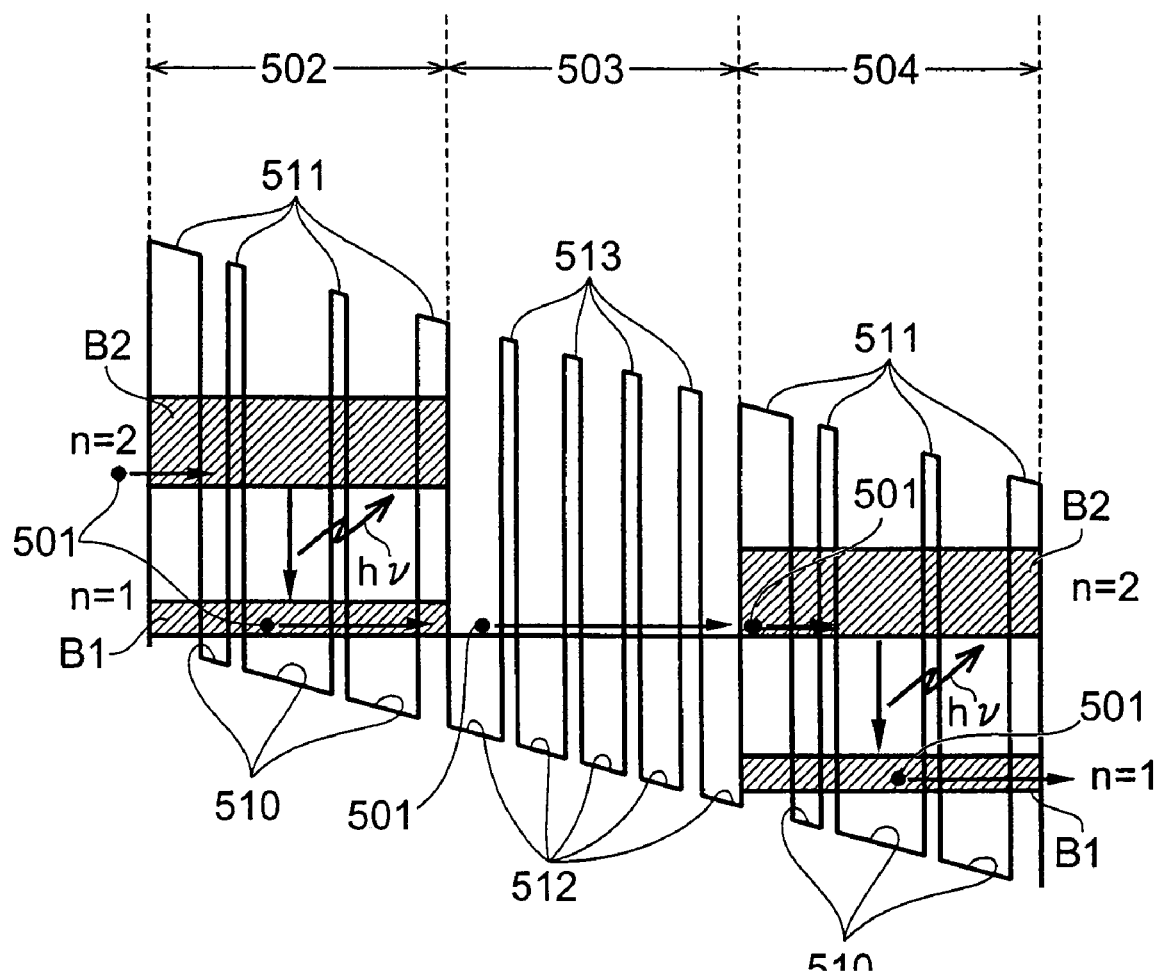
FIG. 8 is a schematic diagram showing an example of a cascade structure and intersubband transitions in a quantum well structure of an active layer.

FIG. 8 is a schematic diagram showing an example of the cascade structure and the intersubband transitions in the quantum well structure of the active layer 51. For the sake of description, in FIG. 8, among the laminated structure of the quantum well light emitting layers and injection layers that form active layer 51, the cascade structure of three layers, that is, the two quantum well light emitting layers 502 and 504 and the single injection layer 503, sandwiched between light emitting layers 502 and 504, is shown.

As shown in FIG. 8, each of quantum well light emitting layers 502 and 504 is formed of quantum well layers 510 and quantum barrier layers 511. In each of light emitting layers 502 and 504, a subband B1 and a subband B2 are formed, for example, from localized quantum levels n=1 and 2 by these quantum well layers 510 and quantum barrier layers 511.

Also, injection layer 503 is disposed between light emitting layers 502 and 504. This injection layer 503 is formed of quantum well layers 512 and quantum barrier layers 513, and quantum well layers 512 are formed to become narrower in width in the direction from light emitting layer 502 to light emitting layer 504.

When a bias voltage is applied to quantum cascade laser 5, having active layer 51 with such a conduction band quantum level structure, electrons 501 become injected selectively into subband B2 of light emitting layer 502. An electron 501 that is injected into subband B2 transits to subband B1, and by this intersubband transition, light hv of a wavelength corresponding to the energy gap between subbands B1 and B2 is generated.

Also, the electron 501 that has transited to subband B1 of quantum well light emitting layer 502 passes from subband B1 through injection layer 503 and is selectively injected into subband B2 of light emitting layer 504. This electron 501 then transits from subband B2 to subband B1 in quantum well light emitting layer 504. In this process, light hv of a wavelength corresponding to the energy gap between subbands B1 and B2 is generated. The light hv that is generated in each of quantum well light emitting layers 502 and 504 is resonated by the optical resonator of laser 5 and output as laser light of a predetermined wavelength. When a plurality of such quantum well light emitting layers, which generate light by the above-described intersubband transitions in the quantum well structure, and injection layers are laminated alternately, electrons move successively in a cascading manner among the quantum well light emitting layers and light hv is generated in the process of intersubband transition at each light emitting layer.

In laser 5, in correspondence to the use of GaAs substrate 50 as the semiconductor substrate, the quantum well layers are formed of GaInNAs, which is a group III-V compound semiconductor containing As and nitrogen (N) as the group V elements, and the quantum barrier layers are formed of AlGaAs. Here, though various composition ratios may be considered for In and N in the general formula, $Ga_xIn_{1-x}N_yAs_{1-y}$ of GaInNAs, for example, the composition ratio x of In is 0.03 and the composition ratio y of N of 0.0044. By arranging the quantum well light emitting layers and the injection layers using such a GaInNAs as the quantum well layers, the effective refractive index of active layer 51 is made greater than that of GaAs substrate 50.

Referring now to FIG. 7, on the side of active layer 51 opposite the GaAs substrate 50 side (on the upper side in the Figure) of active layer 51, waveguide clad layer 52 and waveguide clad layer 53 are formed in that order from the active layer 51 side. Waveguide clad layer 52 is a semiconductor layer formed of an n-type GaAs layer and has a refractive index that is lower than the refractive index of active layer 51. Waveguide clad layer 53 is a semiconductor layer formed of an $n^{++}$-type GaAs layer and has an even lower refractive index than waveguide clad layer 52.

Also as mentioned above, on top of waveguide clad layer 53 is formed contact layer 54 for putting laser 5 in contact with an electrode for input of current.

An example of the thickness and the carrier concentrations of the respective semiconductor layers of the above-described laser 5 are shown in Table 4.

TABLE 4

| | Thickness | Carrier concentration |
|---|---|---|
| Waveguide clad layer 53 | 1 μm | $n = 6 \times 10^{18}$ cm$^{-3}$ |
| Waveguide clad layer 52 | 3.5 μm | $n = 4 \times 10^{16}$ cm$^{-3}$ |
| GaInNAs/AlGaAs active layer 51 | 1.63 μm | — |
| GaAs substrate 50 | — | $n = 0.5 - 4 \times 10^{17}$ cm$^{-3}$ |

In Table 4, active layer 51 is formed by laminating, for example, 36 layers of laminated units, each comprising a quantum well light emitting layer, formed by laminating the abovementioned quantum well layers and quantum barrier layers, and an injection layer, and in this case, the thickness (thickness in the lamination direction), order of lamination, and carrier densities of the respective layers of a laminated unit are, for example, as shown in FIG. 9. The structure of a lamination unit is not restricted to the structure of FIG. 9.

The above-described laser 5 may for example be prepared using a gas source MBE (Molecular Beam Epitaxy) method. With this method, GaInNAs/AlGaAs active layer 51, waveguide clad layer 52, and waveguide clad layer 53 are grown successively on top of GaAs substrate 50 to form the laminated structure of laser 5.

Here, though the AlGaAs layers, which form active layer 51, and the GaAs layers, which form waveguide clad layers 52 and 53, may be grown at a conventional growth temperature, that is, at around 600° C., the GaInNAs layers are preferably grown at approximately 450° C. in consideration of the phase separation of In. Also, Si may be given as an example of the dopant for waveguide clad layers 52 and 53, which are GaAs layers in which a dopant is implanted.

With the above-described laser 5, it is important that the quantum well layers of active layer 51 comprise GaInNAs. Since the quantum well light emitting layers and injection layers that form a cascade structure are formed using group III-V compound semiconductors that contain N, the effective refractive index of active layer 51 is higher than those of GaAs substrate 50 and waveguide clad layer 52 as mentioned above. A waveguide structure is thus formed by GaAs substrate 50, active layer 51, and waveguide clad layer 52. In other words, active layer 51 has, in addition to the function of generating light, the function of a waveguide core layer that guides the generated light.

Figure 10:
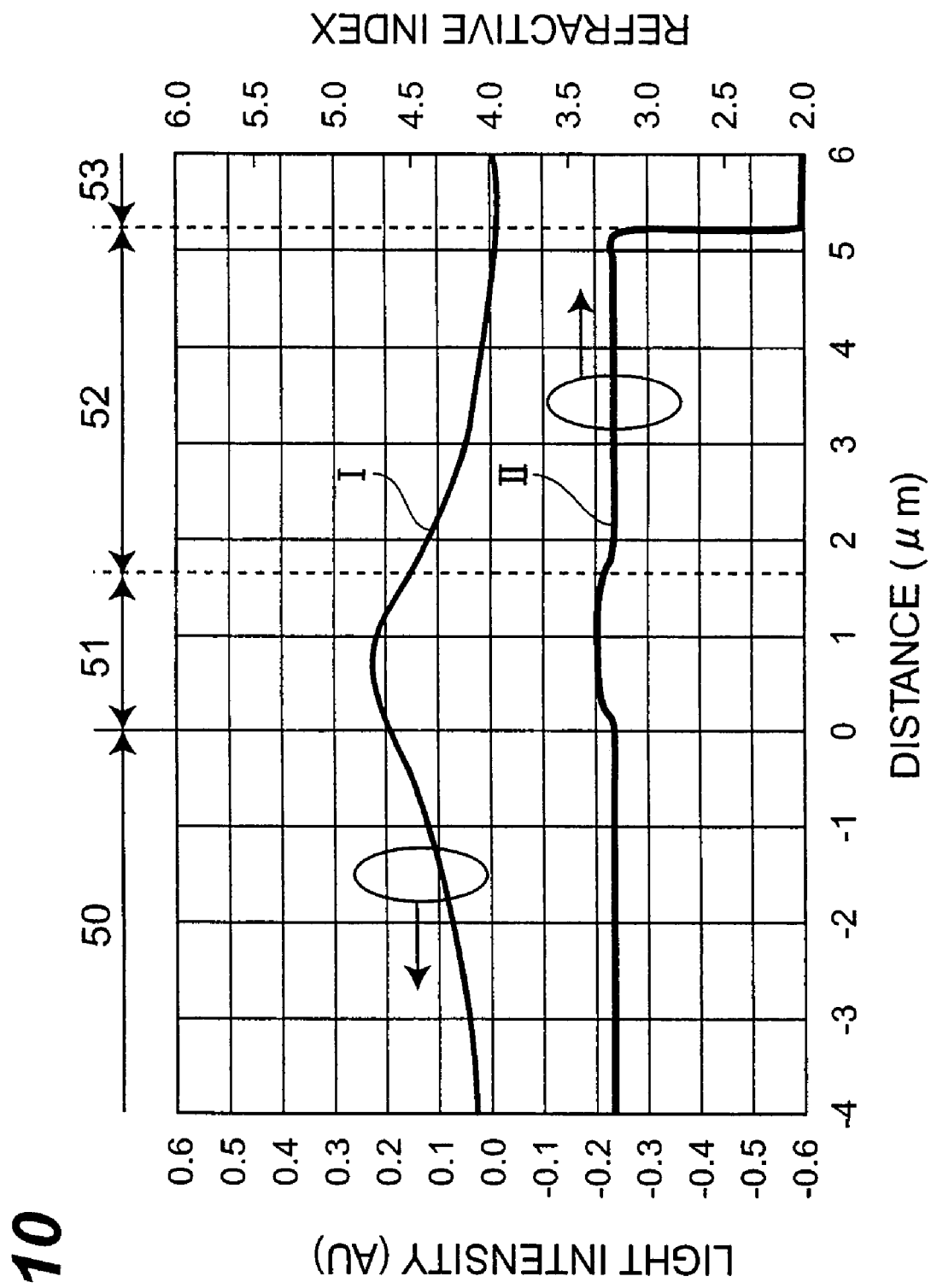
FIG. 10 is a diagram showing the refractive index distribution and the light intensity distribution of the quantum cascade laser of FIG. 7.

FIG. 10 is a diagram showing the refractive index distribution of laser 5 and the light intensity distribution of the light generated at active layer 51 in laser 5. The abscissa axis indicates the distance x to each layer with respect to the interface between GaAs substrate 50 and active layer 51 in FIG. 7. The ordinate axis indicates the light intensity and the refractive index. Solid curve I and solid curve II indicate the light intensity distribution and the refractive index distribution, respectively. The calculation conditions are as follows. That is, it was deemed that the quantum well layer of active layer 51 is formed of $Ga_{0.97}In_{0.03}N_{0.0044}As_{0.9956}$ and the quantum barrier layer is formed of $Al_{0.33}Ga_{0.67}As$. Also, active layer 51 was deemed to be formed by laminating 36 laminated units, each comprising a quantum well light emitting layer, formed by laminating the abovementioned quantum well layers and quantum barrier layers, and an injection layer. The thickness (thickness in the lamination direction) and the order of lamination of each laminated unit were set as shown in FIG. 9. Furthermore, it was deemed that light of a wavelength of 7 μm is emitted from active layer 51 of the above-described arrangement.

FIG. 10 shows that the refractive index of active layer 51 in laser 5 is 3.30, and thus as mentioned above, active layer 51 is higher in refractive index than GaAs substrate 50 (refractive index: 3.23) and waveguide clad layer 52. Thus as can be understood from solid curve I, light containment in active layer 51 is enabled. The light containment factor in this case is 0.35.

Figure 11:
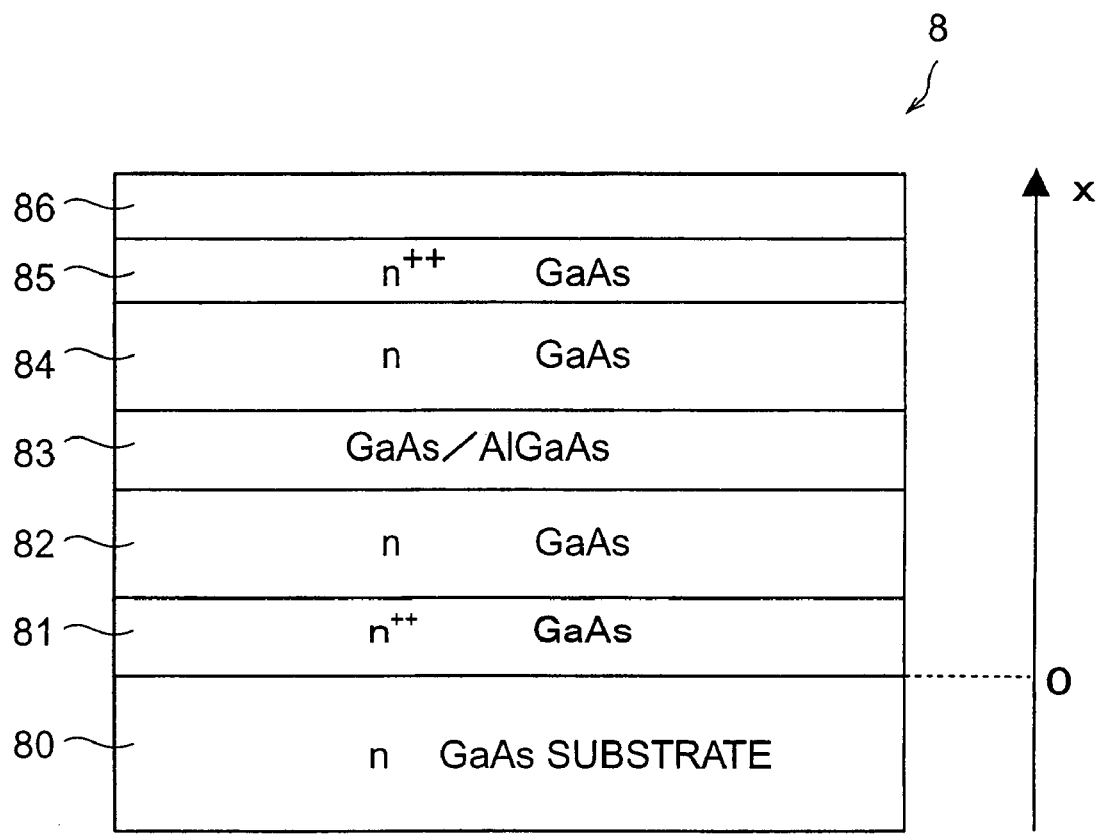
FIG. 11 is a sectional side view showing an example of the arrangement of a prior-art quantum cascade laser.

Here, for comparison, an arrangement example of a prior-art quantum cascade laser shall be described. FIG. 11 is a sectional side view showing a prior-art quantum cascade laser. Laser 8, shown in FIG. 11, is a GaAs/AlGaAs type quantum cascade laser that uses a GaAs substrate.

Laser 8 is arranged by the successive lamination of waveguide clad layer 81, waveguide core layer 82, active layer 83, waveguide core layer 84, waveguide clad layer 85, and contact layer 86 on top of GaAs substrate 80.

Waveguide clad layers 81 and 85 are semiconductor layers comprising $n^{++}$-type GaAs layers and wave guide core layers 82 and 84 are semiconductor layers comprising n-type GaAs layers. Active layer 83 has the same cascade structure as active layer 51 of FIG. 7. However, with active layer 83, the quantum well layers are formed of GaAs and the quantum barrier layers are formed of AlGaAs.

An example of the carrier concentration of GaAs substrate 80 and the thickness and the carrier concentrations of the respective layers of laser 8 are shown in Table 5.

TABLE 5

| | Thickness | Carrier concentration |
|---|---|---|
| Waveguide clad layer 85 | 1 μm | $n = 6 \times 10^{18}$ cm$^{-3}$ |
| Waveguide core layer 84 | 3.5 μm | $n = 4 \times 10^{16}$ cm$^{-3}$ |
| GaAs/AlGaAs active layer 83 | 1.63 μm | — |
| Waveguide core layer 82 | 3.5 μm | $n = 4 \times 10^{16}$ cm$^{-3}$ |

TABLE 5-continued

| | Thickness | Carrier concentration |
|---|---|---|
| Waveguide clad layer 81 | 1.0 µm | n = 6 × 10$^{18}$ cm$^{-3}$ |
| GaAs substrate 80 | — | n = 3 × 10$^{18}$ cm$^{-3}$ |

In Table 5, active layer 83 is formed by laminating, for example, 36 layers of laminated units, each comprising a quantum well light emitting layer, formed by laminating quantum well layers (GaAs) and quantum barrier layers (AlGaAs), and an injection layer, and in this case, the thickness (thickness in the lamination direction), order of lamination, and carrier densities of the respective layers of a laminated unit are, for example, as shown in FIG. 12.

Laser 8 differs from laser 5 in that GaAs substrate 80, which is doped to a high concentration of approximately 3×10$^{18}$ cm$^{-3}$, is used as the semiconductor substrate, GaAs is used as the quantum well layers of active layer 83, and a waveguide clad layer 81 and a waveguide core layer 82 are disposed between active layer 83 and GaAs substrate 80.

Figure 13:
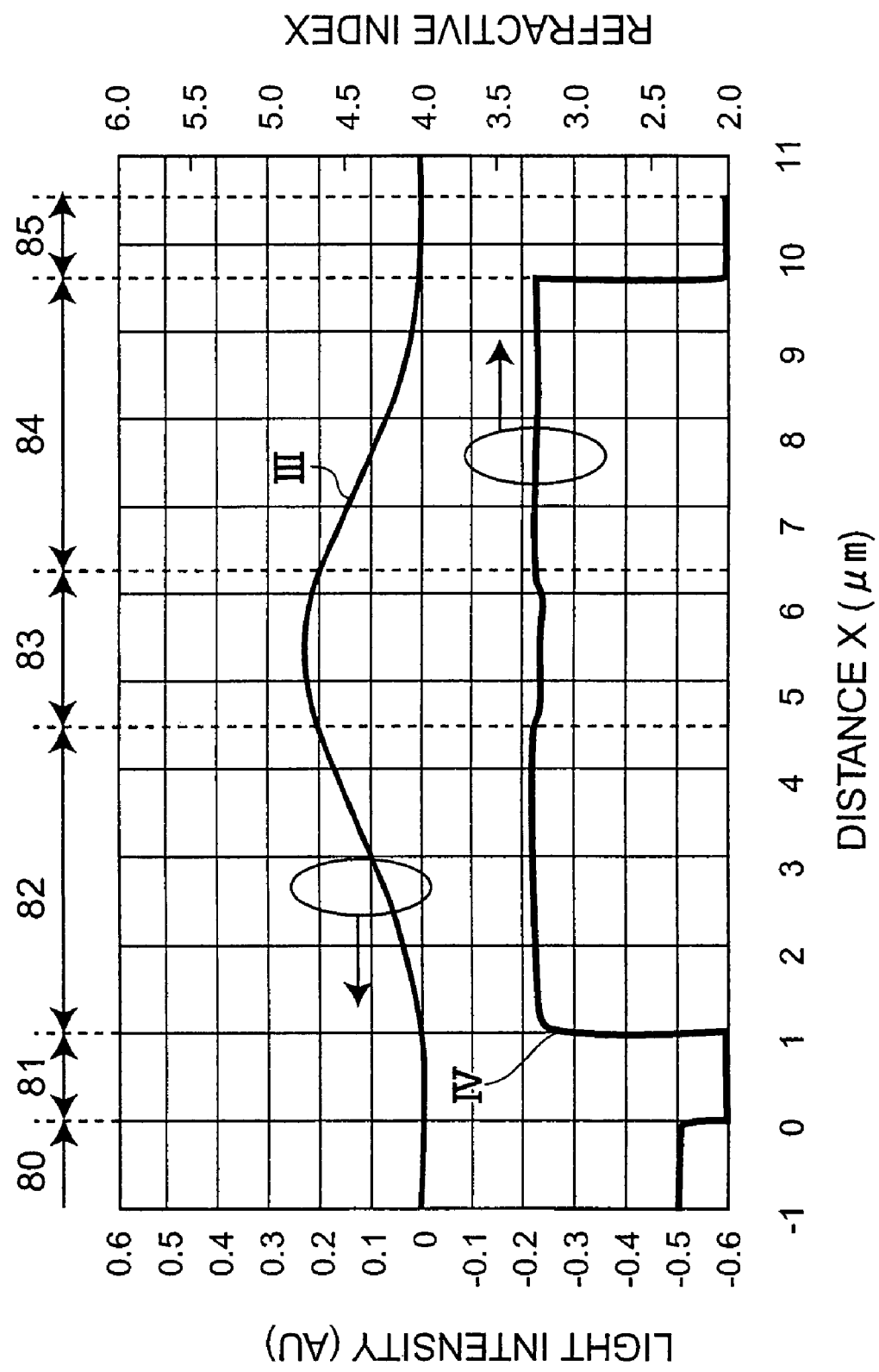
FIG. 13 is a diagram showing the refractive index distribution and the light intensity distribution of the quantum cascade laser of FIG. 11.

FIG. 13 is a diagram showing the refractive index distribution and the light intensity distribution of laser 8. The abscissa axis indicates the distance x to each layer with respect to the interface between GaAs substrate 80 and waveguide clad layer 81 in FIG. 11. The ordinate axis indicates the light intensity and the refractive index. Solid curve III and solid curve IV indicate the light intensity distribution and the refractive index distribution, respectively. The calculation conditions are as follows. That is, it was deemed that the quantum well layer of active layer 83 is formed of GaAs and the quantum barrier layer is formed of Al$_{0.33}$Ga$_{0.67}$As. Also, active layer 83 was deemed to be formed by laminating 36 laminated units, each comprising a quantum well light emitting layer, formed by laminating quantum well layers and quantum barrier layers, and an injection layer. The thickness (thickness in the lamination direction) and the order of lamination of each laminated unit were set as shown in FIG. 12. Furthermore, it was deemed that light of a wavelength of 9 µm is emitted from active layer 83 of the above-described arrangement. The effective refractive index of active layer 83 is 3.21 and lower than the refractive indices of GaAs waveguide core layers 82 and 84. Thus in order to contain light in active layer 83, waveguide clad layers 81 and 85, which are doped to high concentrations, are provided.

As shown in FIG. 13, since the effective refractive index of active layer 83 is less than the refractive indices of waveguide core layers 82 and 84, light is not adequately contained in active layer 83. Thus in order to reduce the free carrier absorption in waveguide clad layers 81 and 85, waveguide core layers 82 and 84 has to be made adequately thick (for example, 3.5 µm) to attenuate the light intensity before the light reaches waveguide clad layers 81 and 85. Since the thickness of laser 8 is thus increased, the serial resistance of the element is increased and high self-heating occurs.

On the other hand, with laser 5 of the present embodiment, since GaInNAs is used in active layer 51 as mentioned above, GaAs substrate 50 can be used as a waveguide clad layer. Waveguide clad layer 81 and waveguide core layer 82 in laser 8 shown in FIG. 11 can thus be omitted. Since the layer thickness above GaAs substrate 50 is thus thinned and the element resistance is made small, self-heating of the element is reduced. CW operation at a thermoelectrically cooled temperature, CW operation at room temperature, as well as high output and other high performance can thus be realized in a quantum cascade laser that uses a GaAs substrate that is inexpensive and excellent in crystallinity. Furthermore, since there only a few layers on top of GaAs substrate 50, the arrangement enables simplification of the manufacturing process and improvement of the manufacturing efficiency of laser 5.

Also, normally with an interband transition laser based on electron-hole recombination, a lattice matched composition was avoided and a composition of a high strain region was used to avoid the weakening of containment with respect to the holes. This is because in the region of lattice matching with GaAs, the valence band level of GaInNAs approaches that of GaAs and a valence band discontinuity is thus substantially eliminated.

With laser 5, since only transitions between conduction band subbands are used, GaInNAs of a region of lattice matching with GaAs can be used. And since by using GaInNAs that is lattice matched with GaAs, good heteroepitaxial growth can be achieved, laser 5 can be provided with even better crystallinity.

Though in the above description of the arrangement of laser 5, the composition ratio of nitrogen in the GaInNAs used in active layer 51 is set to 0.44% as an example, the composition ratio of nitrogen may be no less than 0.1% and no more than 40% and preferably no less than 0.1% and no more than 10%.

Figure 14:
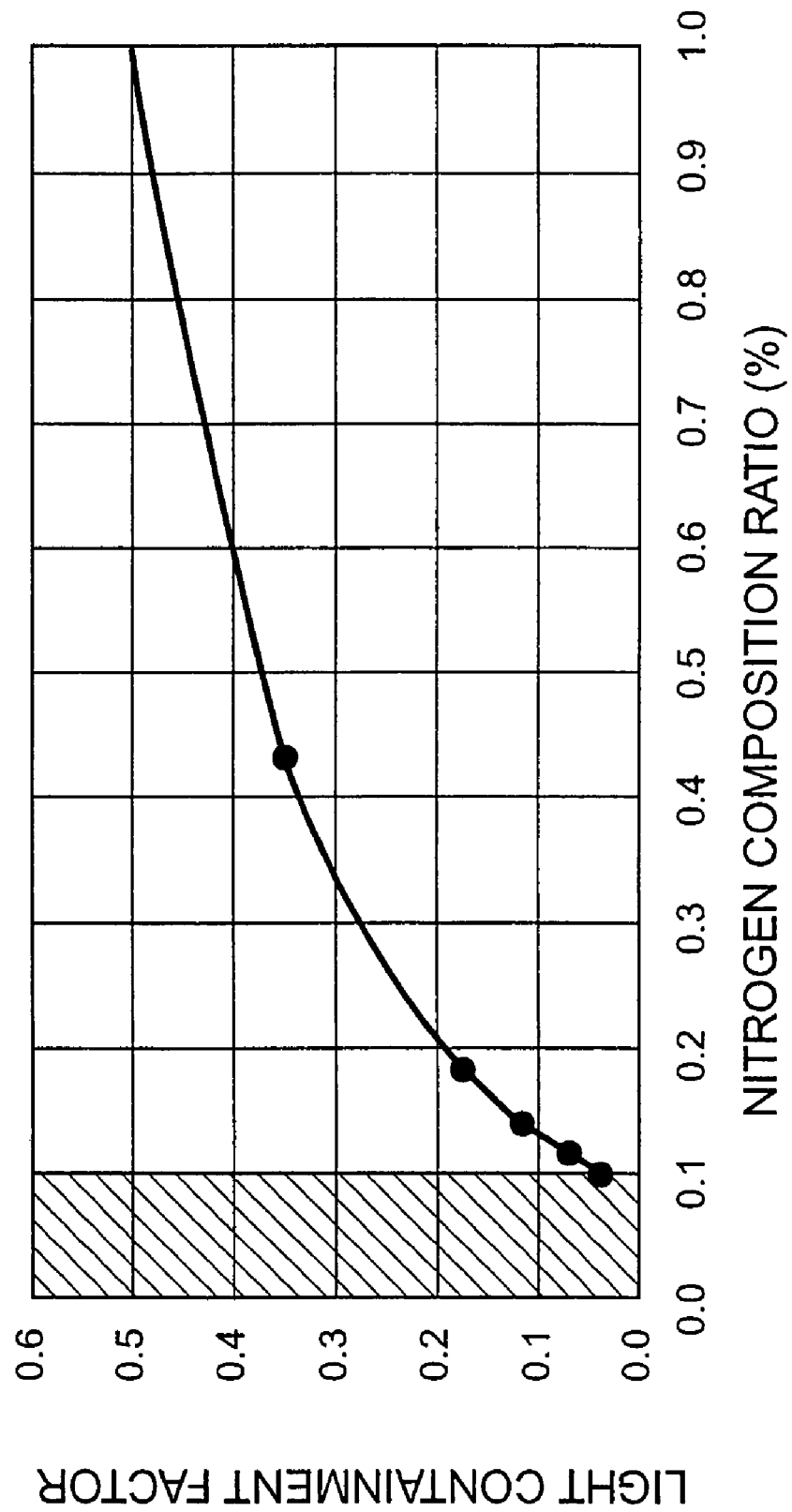
FIG. 14 is a diagram showing the relationship of the composition ratio of nitrogen in the GaInNAs, which forms the active layer, and the light containment factor.

FIG. 14 is a diagram showing the relationship of the composition ratio of nitrogen in the GaInNAs in laser 5 and the light containment factor of active layer 51. More specifically, the Figure shows the variation of the light containment factor (in other words, the variation of the refractive index) of active layer 51 when nitrogen is added to Ga$_{0.97}$In$_{0.03}$As, with which the composition ratio of In is 0.03. As can be understood from FIG. 14, in the region in which the composition ratio of nitrogen is less than 0.1% (the hatched part of FIG. 14) a calculation solution does not exist and light containment is not achieved. In other words, when the composition ratio of nitrogen in GaInNAs is less than 0.1%, the waveguide mode of active layer 51 is a leakage mode and laser emission does not occur. It is thus favorable for the composition ratio of nitrogen in GaInNAs to be no less than 0.1%. In the calculation, it was deemed that light of 7 µm is generated at active layer 51.

Meanwhile, it is known that, due to the electronegativity of nitrogen being large in comparison to the other atoms, GaInNAs and other group III-N-V type mixed crystal semiconductors exhibit a very large band bowing with respect to the mixed crystal composition. Though it is predicted that when nitrogen is added to GaAs, the band gap will normally become greater since GaAs will become closer to GaN of wide gap, it is known that due to the very large band bowing, the band gap decreases below that of GaAs once and then increases towards that of GaN. According to Bellaiche et al., the band gap decreases rapidly until the composition ratio of nitrogen is approximately 10% and thereafter decreases gradually and turns to increasing when the composition ratio of nitrogen becomes 40% or more (Phys. Rev. B. Vol. 54, p17568 (1996)).

Also, GaInAs, especially GaAs, becomes reduced in band gap and also becomes reduced in lattice constant with the addition of nitrogen. Meanwhile, the band gap decreases and the lattice constant increases with the addition of In. Thus though the composition of Ga$_{1-x}$In$_x$N$_y$As$_{1-y}$ that is lattice matched with GaAs can take on various values according to In and N, since the reduction of the band gap due to addition of nitrogen occurs until the composition ratio of nitrogen is approximately 40%, the composition ratio of nitrogen is preferably no more than 40%.

Figure 15:
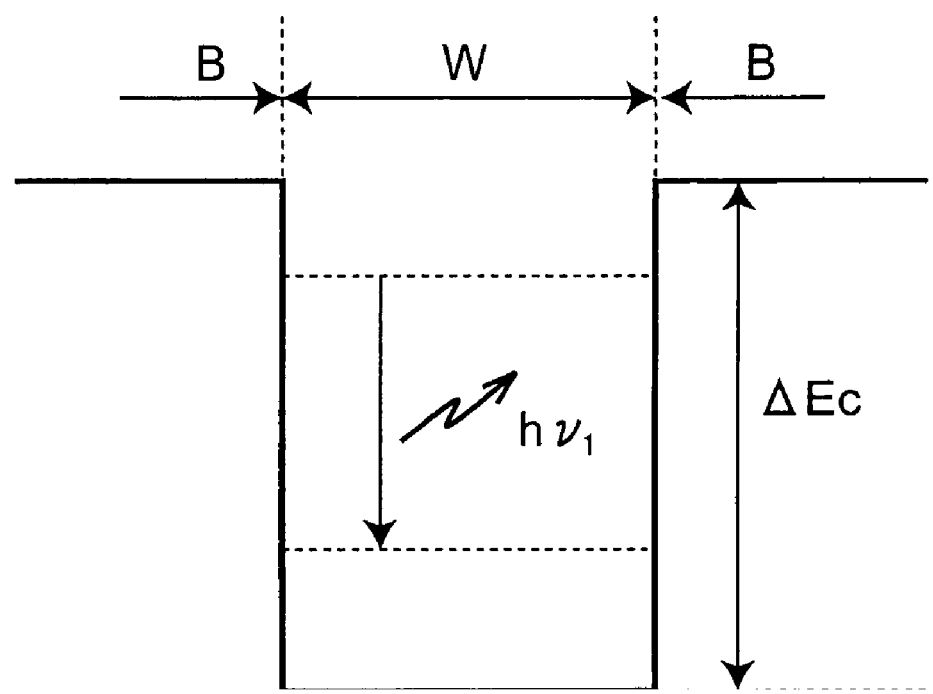
FIG. 15 is a schematic diagram of an example of the conduction band discontinuity between a quantum well layer and quantum barrier layers in a prior-art quantum cascade laser.

Though in the literature of C. Sirtori et al., it is indicated that laser emission at a wavelength of 9 μm occurred at 77K, with a quantum cascade laser, the shortest emission wavelength that can be achieved is dependent on the intrinsic conduction band discontinuity ($\Delta E_c$) of the material. FIG. 15 is a schematic diagram of an example of the conduction band discontinuity between a quantum well layer W and quantum barrier layers B in a prior-art quantum cascade laser that uses a GaAs substrate. FIG. 15 illustrates the case where quantum well layer W is formed of GaAs and quantum barrier layers B are formed of $Al_{0.33}Ga_{0.67}As$. For the arrangement shown in FIG. 15, $\Delta E_c$ is estimated to be 0.264 eV and if it is presumed that half of this is used in intersubband transitions, light $hv_1$ of a wavelength of approximately 8 μm is generated.

Priorly, the short wavelength limit of a quantum cascade laser using a GaAs substrate was 8 μm as mentioned above, and the short wavelength limit of a quantum cascade laser using an InP substrate was 3.5 μm. Though shortening of the wavelength of a quantum cascade laser has been achieved with nitride materials (GaN/AlN) with a large conduction band discontinuity, adequate results have not been obtained since there are no satisfactory conductive substrates and there are difficulties in terms of both design and manufacturing technologies.

Figure 16:
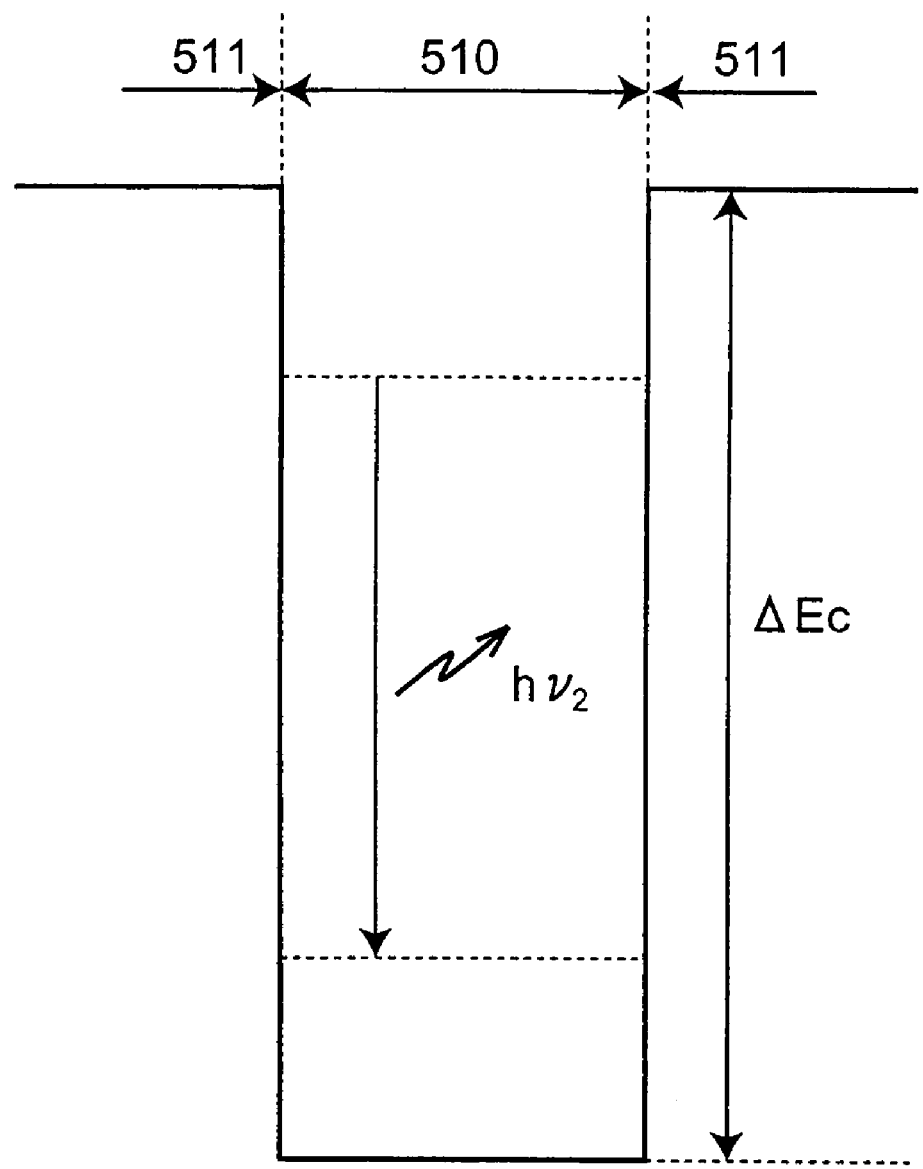
FIG. 16 is a schematic diagram of an example of the conduction band discontinuity between a quantum well layer and quantum barrier layers in the quantum cascade laser of the fifth embodiment.

On the other hand, shortening of the emission wavelength is enabled with the arrangement of laser 5. FIG. 16 is a schematic diagram of an example of the conduction band discontinuity in the case where a quantum well layer (for example, 510 in FIG. 8) is formed of $Ga_{0.97}In_{0.03}N_{0.02}As_{0.98}$ and quantum barrier layers (for example, 511 in FIG. 8) are formed of $Al_{0.33}Ga_{0.67}As$. The conduction band discontinuity $\Delta E_c$ in this case is estimated to be 0.611 eV. If as in the above-described case, half of this $\Delta E_c$ is presumed to be used in intersubband transitions, light $hv_2$ of a wavelength of approximately 4 μm is generated, thus far surpassing the short wavelength limit of 8 μm of the prior art. Due to the use of intersubband transitions, a quantum cascade laser has the characteristics of being fast in frequency response, small in relaxation oscillation, enabling multiple wavelength emission, etc. Thus if shortening of the emission wavelength is enabled as described above, application as a communication light source is also possible.

As described above, with quantum cascade laser 5 of the arrangement shown in FIG. 7, since the quantum well layer of active layer 51 is formed of nitrogen-containing GaInNAs, the effective refractive index of active layer 51 is greater than that of GaAs substrate 50. Since in this case, GaAs substrate 50 can be made to function as a clad layer, active layer 51 can be formed adjacently on top of GaAs substrate 50. The layer thickness above the semiconductor substrate of laser 5 is thus made thinner than that of the prior art, the element resistance of laser 5 is reduced, and self-heating by laser 5 is restrained. Laser 5 can thus be made high in output and continuous (CW) emission at high temperature is also enabled.

Figure 17:
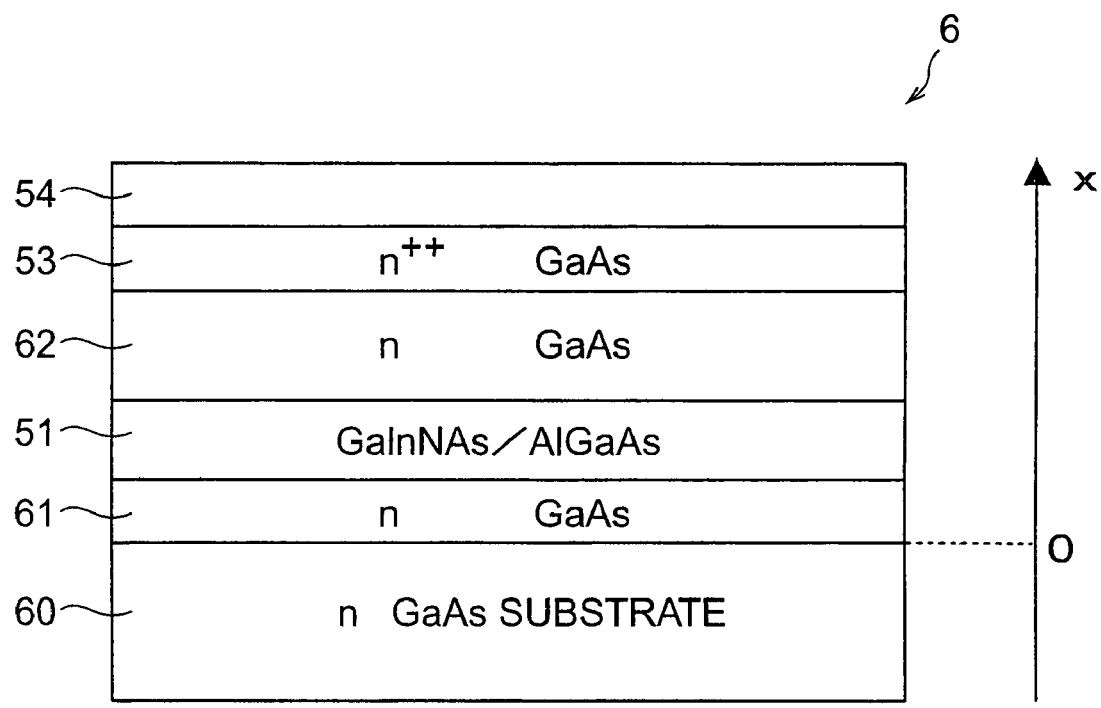
FIG. 17 is a sectional side view showing the arrangement of a sixth embodiment of a quantum cascade laser.

FIG. 17 is a sectional side view showing the arrangement of a sixth embodiment of this invention's quantum cascade laser. As with laser 5 shown in FIG. 7, laser 6, shown in FIG. 17 is a quantum cascade laser that uses a GaAs substrate.

Laser 6 is arranged by successively laminating an n-type GaAs layer 61, GaInNAs/AlGaAs active layer 51, n-type GaAs layer 62, waveguide clad layer 53, and contact layer 54 on top of a GaAs substrate 60 that is doped to a high concentration of approximately $3 \times 10^{18}$ cm$^{-3}$. As with laser 5 of the fifth embodiment, of the side surfaces of laser 6, mirror surfaces, which form the optical resonator of this laser 6, are formed on two predetermined surfaces that oppose each other. An example of the carrier concentration of GaAs substrate 60 and the thickness and the carrier concentrations of the respective layers of laser 6 are shown in Table 6. The arrangement of active layer 51 is the same as that of the fifth embodiment and, in the present example, 36 laminated units of the arrangement shown in the table of FIG. 9 are laminated.

TABLE 6

| | Thickness | Carrier concentration |
|---|---|---|
| Waveguide clad layer 53 | 1 μm | n = 6 × 10$^{18}$ cm$^{-3}$ |
| Waveguide core layer 62 | 3.5 μm | n = 4 × 10$^{16}$ cm$^{-3}$ |
| GaInNAs/AlGaAs active layer 51 | 1.63 μm | — |
| Waveguide core layer 61 | 1 μm | n = 4 × 10$^{16}$ cm$^{-3}$ |
| GaAs substrate 60 | — | n = 3 × 10$^{18}$ cm$^{-3}$ |

Laser 6 differs from laser 5 in that GaAs substrate 60, which is doped to a high concentration of approximately $3 \times 10^{18}$ cm$^{-3}$, is used as the semiconductor substrate and an n-type GaAs layer 61 is disposed between active layer 51 and GaAs substrate 60.

Laser 6 of the above-described arrangement also has active layer 51 that uses GaInNAs in the quantum well layers and the effective refractive index of active layer 51 is greater than those of GaAs substrate 60 and GaAs layers 61 and 62. Thus there is no need to provide waveguide clad layer 81 between active layer 51 and GaAs substrate 60 as was the case in laser 8 of FIG. 11 and GaAs layer 61 can thus be made thin. Since the layer thickness above GaAs substrate 60 can thus be made thin, the element resistance can be reduced as in the fifth embodiment. Also as with the fifth embodiment, the emission wavelength of laser 6 can be shortened in comparison to prior-art quantum cascade lasers that use a GaAs substrate.

Figure 18:
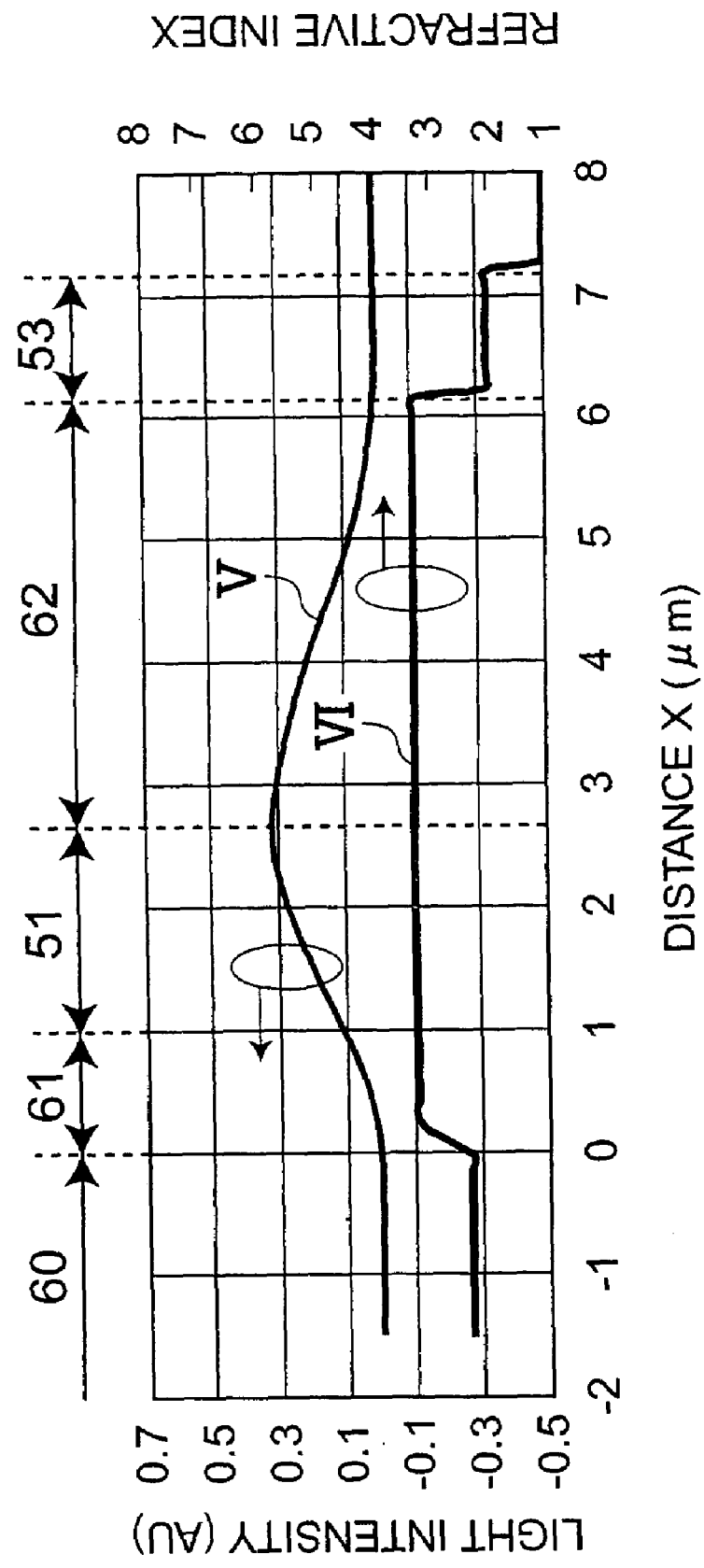
FIG. 18 is a diagram showing the refractive index distribution and the light intensity distribution of the quantum cascade laser of FIG. 17.

FIG. 18 is a diagram showing the light intensity distribution and the refractive index distribution of laser 6 of the present embodiment. The calculation conditions are the same as those of the fifth embodiment. The abscissa axis indicates the distance x to each layer with respect to the interface between GaAs substrate 60 and GaAs layer 61 in FIG. 17. The ordinate axis indicates the light intensity and the refractive index. Solid curve V and solid curve VI indicate the light intensity distribution and the refractive index distribution, respectively. As can be understood from FIG. 18, n-type GaAs layer 61, which lies on top of GaAs substrate 60 and between GaAs substrate 60 and active layer 51, serves as core layer along with GaAs layer 62 at the opposite side across active layer 51.

Figure 19:
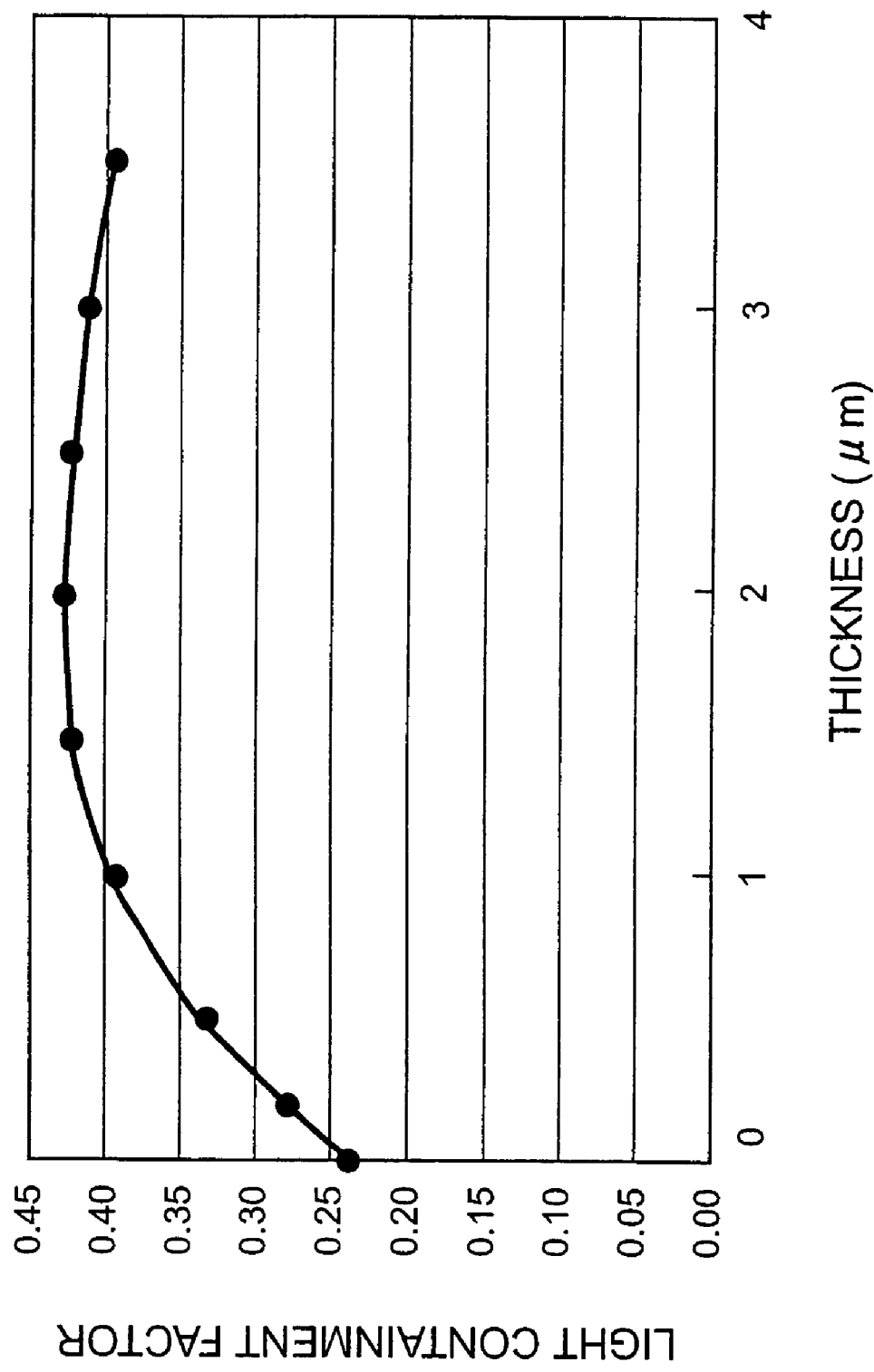
FIG. 19 is a diagram showing the relationship of the thickness of the GaAs layer and the light containment factor of the quantum cascade laser of FIG. 17.

FIG. 19 is a diagram showing the relationship of the thickness of GaAs layer 61 and the light containment factor. The abscissa axis indicates the thickness of GaAs layer 61 and the ordinate axis indicates the light containment factor. As can be understood from FIG. 19, the light containment factor increases monotonously in the thickness range of 0.0 μm to 2.0 μm of GaAs layer 61 and decreases when the thickness exceeds 2.0 μm. The thickness of GaAs layer 61 is thus preferably no more than 2.0 μm.

Also, when the thickness of GaAs layer 61 is close to 1.0 µm, the light containment factor is approximately 0.40 and when the thickness is close to 2.0 µm, the light containment factor is approximately 0.43. As can thus be understood, the provision of GaAs layer 61 and suitable adjustment of its thickness enables reinforcement of the effect of containing light in active layer 51.

Figure 20:
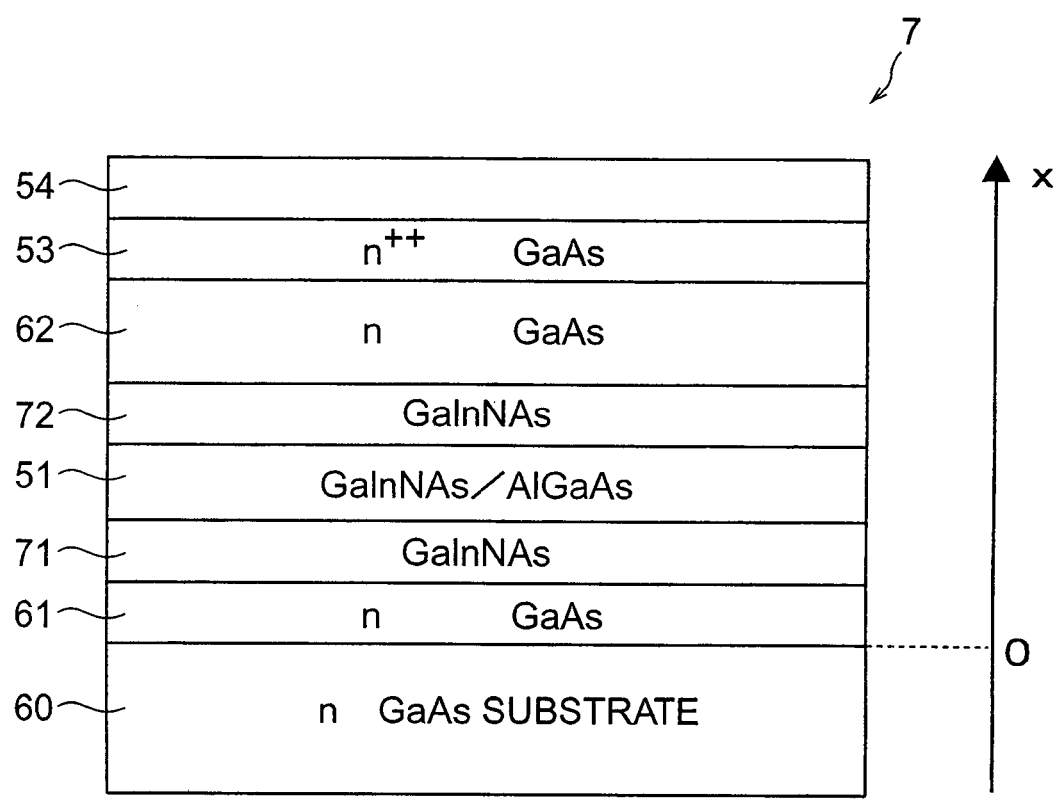
FIG. 20 is a sectional side view showing the arrangement of a seventh embodiment of a quantum cascade laser.

FIG. 20 is a sectional side view showing the arrangement of a seventh embodiment of this invention's quantum cascade laser. As with laser 5 shown in FIG. 7, laser 7, shown in FIG. 20 is a quantum cascade laser that uses a GaAs substrate.

Laser 7 differs from laser 6 of the sixth embodiment in that undoped GaInNAs layer 71 and 72 are disposed adjacent active layer 51 and respectively between GaAs layer 61 and active layer 51 and between active layer 51 and GaAs layer 62. The typical thickness of each of GaInNAs layers 71 and 72 is, for example, 0.3 µm.

With the above-described arrangement, the respective layers between GaAs layer 61 and GaAs layer 62, that is, GaInNAs layer 71, active layer 51, and GaInNAs layer 72 function as a whole as a core layer and form a waveguide structure along with GaAs substrate 60 and waveguide clad layer 53.

Though the composition of the abovementioned GaInNAs layers 71 and 72 is the same as the composition of the GaInNAs used in active layer 51, the refractive index of GaInNAs layers 71 and 72 is higher than the effective refractive index of GaInNAs/AlGaAs active layer 51. The effective refractive index of the core layer, formed of the respective layers between the abovementioned GaAs layers 61 and 62, is thus made large. The light containment can thereby be strengthened. Since the effective refractive index of the core layer, formed of active layer 51 and GaInNAs layers 71 and 72 is greater than those of GaAs substrate 60 and GaAs layers 61 and 62, GaInNAs layers 71 and 72 may be made thin, as exemplified by the typical thickness (0.3 µm) of each of GaInNAs layers 71 and 72. The layer thickness of the entirety above GaAs substrate 60 is thus made thinner than that of the prior-art laser 8 shown in FIG. 11 and the element resistance can be reduced. Also, as in the case of the fifth embodiment, the emission wavelength of the above-described laser 7 can be made shorter than in the prior-art quantum cascade laser using a GaAs substrate.

Figure 21:
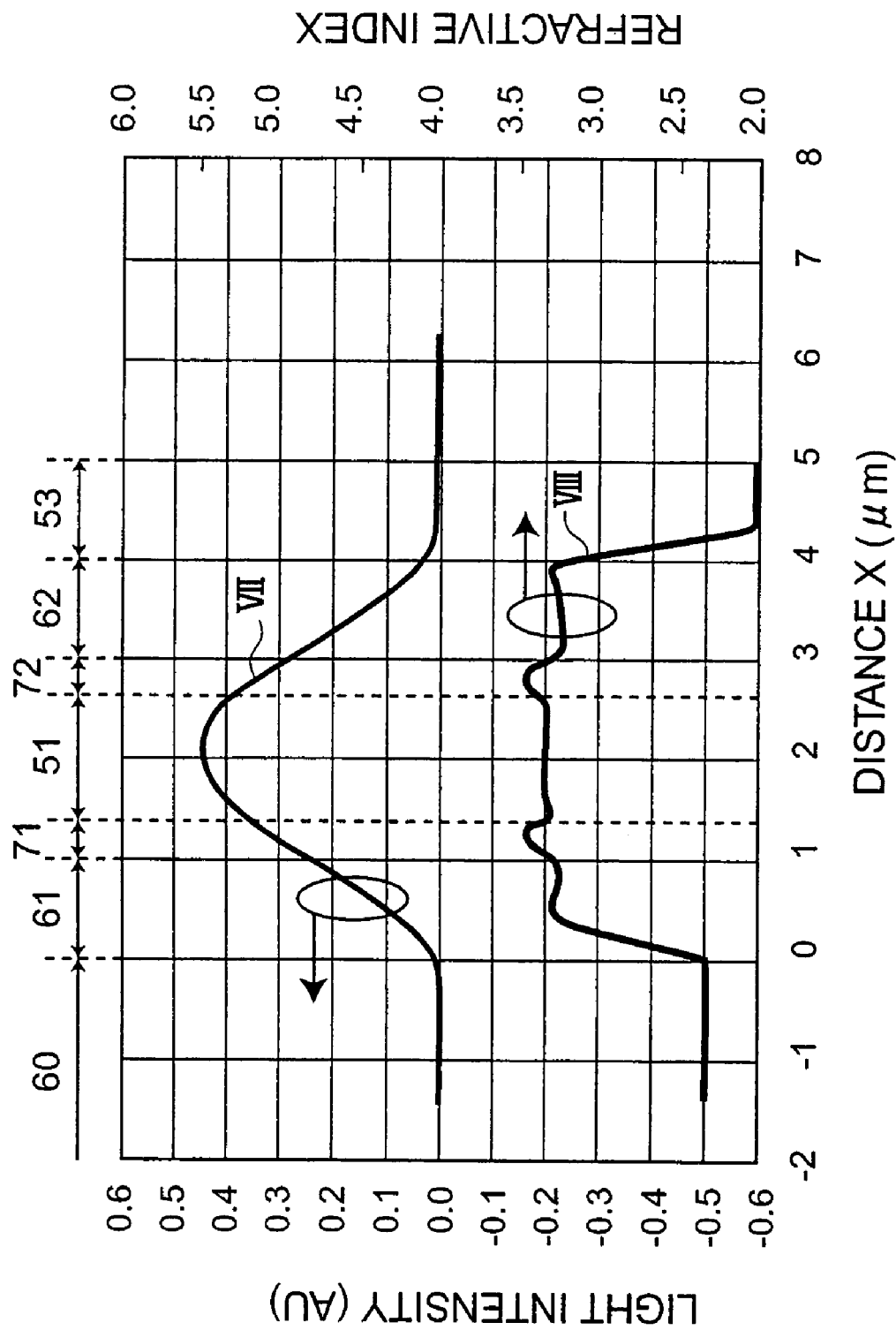
FIG. 21 is a diagram showing the refractive index distribution and the light intensity distribution of the quantum cascade laser of FIG. 20.

FIG. 21 is a diagram showing the light intensity distribution and the refractive index distribution of laser 7. The calculation conditions are the same as those of the fifth embodiment. The abscissa axis and the ordinate axis are the same as those of FIG. 18. Solid curve VII and solid curve VIII in FIG. 21 indicate the light intensity distribution and the refractive index distribution, respectively. As can be understood from FIG. 21, the layers made up of the respective layers between GaAs layers 61 and 62 function as a whole as a core layer.

Though preferred embodiments of this invention have been described above, this invention is obviously not limited to the above-described embodiments. For example, though the quantum well layers in active layer 51 are formed of GaInNAs, it is sufficient that these be formed of a group III-V compound semiconductor, containing nitrogen (N) and at least one element among As, P, and Sb as the group V elements.

Also, though an example of using a gas source MBE method was indicated in regard to the method of preparing the laminated structure in the quantum cascade laser, the laminated structure may be prepared instead by a solid-state source MBE method, in which a N (nitrogen) source is used as the plasma source, an MOCVD method, etc.

Also, though for example with laser 5 shown in FIG. 7, active layer 51 is preferably lattice matched with GaAs substrate 50, since optical characteristics are given priority, some degree of lattice mismatching is tolerable as long as it is within a range that will not influence the laser characteristics excessively.

Furthermore, though a GaAs substrate doped to a low concentration is used as the GaAs substrate in the fifth embodiment, an undoped GaAs substrate may be used instead. Also, though a GaAs substrate doped to a high concentration is used as the GaAs substrate in each of the sixth and seventh embodiments, a GaAs substrate doped to a low concentration may be used instead. Also, though with the seventh embodiment, GaInNAs layers 71 and 72 are disposed at the respective outer sides of active layer 51 in the laminated structure on GaAs substrate 60, the GaInNAs layers do not have to be provided at both sides necessarily and these layers furthermore do not have to be GaInNAs layers. For example, it is sufficient that a semiconductor layer, formed of a group III-V compound semiconductor, containing nitrogen and at least one element among As, P, and Sb as the group V elements, be disposed adjacent active layer 51 at least either between active layer 51 and GaAs substrate 60 or at the side of active layer 51 opposite the GaAs substrate 60 side.

Also, though in the description of the cascade structure of active layer 51, it was deemed for example that two subbands B1 and B2 are formed, this invention is not limited to cases in which two subbands are formed. That is, three or more subbands may be formed by changing the film thickness, etc., of the quantum well layers and quantum barrier layers. Light of different wavelengths can be generated by making use of different intersubband transitions in such cases.

As has been described in detail above, this invention's quantum cascade laser provides the following effects. That is, by an arrangement in which an active layer, formed on a GaAs or InP semiconductor substrate and having multiple stages of quantum well light emitting layers with injection layers in between, is provided with a waveguide structure wherein waveguide core layers, by which infrared light or other light generated inside a laser is guided, are formed using a group III-V compound semiconductor containing N as the group V element, waveguide loss due to free carrier absorption of the generated light is reduced. Also with this waveguide structure, the effective refractive index of the waveguide core layer is increased. The thickness of the waveguide core layers and clad layers that are required for light containment can thus be made thin.

Also, with this invention's quantum cascade laser, by using a group III-V compound semiconductor, containing nitrogen and at least one element among As, P, and Sb as the group V elements, in the active layer, the effective refractive index of the active layer can be made higher than that of the GaAs substrate. The semiconductor substrate formed of GaAs can thus be made to function as a clad layer and the thickness of the element can thereby be made thin. The element resistance is thereby reduced and self-heating can be restrained. Also, the layer structure between the semiconductor substrate formed of GaAs and the active layer can be simplified.

Furthermore with this invention's quantum cascade laser, shortening of the emission wavelength can be realized. The short wavelength limit, which was priorly limited to the middle infrared range, can thereby be extended to the near infrared range.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A quantum cascade laser having a unipolar laser device structure, comprising:

a semiconductor substrate formed of GaAs; and an active layer, disposed on said semiconductor substrate and having a plurality of quantum well light emitting layers, each having a quantum well structure including a quantum well layer and quantum barrier layer and generating light by means of intersubband transitions in the quantum well structure, and a plurality of injection layers, respectively disposed between the plurality of quantum well light emitting layers and forming a cascade structure along with said quantum well light emitting layers; and wherein said quantum well light emitting layers and said injection layers of said active layer are formed to contain group III-V compound semiconductors, each containing, as the group V elements, N and at least one element selected from the group consisting of As, P, and Sb; and wherein, in said active layer, electrons move successively in a cascading manner among said quantum well light emitting layers, and light is generated in the process of the intersubband transition at each light emitting layer; and wherein the active layer is disposed directly on the substrate.

2. The quantum cascade laser according to claim 1, wherein the composition ratio of N in said group III-V compound semiconductor is no less than 0.1% and no more than 40%.

3. The quantum cascade laser according to claim 1, further comprising a semiconductor layer formed adjacent said active layer, disposed at the side of said active layer opposite the semiconductor substrate side and formed of a group III-V compound semiconductor.

* * * * *